(12) United States Patent
Naito

(10) Patent No.: US 10,056,370 B2
(45) Date of Patent: Aug. 21, 2018

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/182,602

(22) Filed: Jun. 15, 2016

(65) Prior Publication Data
US 2017/0018547 A1  Jan. 19, 2017

(30) Foreign Application Priority Data

Jul. 16, 2015 (JP) .................................. 2015-142191
Sep. 16, 2015 (JP) .................................. 2015-183207

(51) Int. Cl.
| | |
|---|---|
| *H01L 27/06* | (2006.01) |
| *H01L 29/06* | (2006.01) |
| *H01L 29/73* | (2006.01) |
| *H01L 29/739* | (2006.01) |
| *H01L 29/861* | (2006.01) |

(52) U.S. Cl.
CPC ...... *H01L 27/0664* (2013.01); *H01L 29/0615* (2013.01); *H01L 29/7397* (2013.01); *H01L 29/861* (2013.01)

(58) Field of Classification Search
CPC .................................................. H01L 27/0664
USPC ....................................................... 257/140
See application file for complete search history.

(56) References Cited

U.S. PATENT DOCUMENTS

| | | | |
|---|---|---|---|
| 5,281,872 A * | 1/1994 | Mori | .................... H01L 27/0248 327/108 |
| 5,729,032 A | 3/1998 | Tomomatsu et al. | |
| 6,180,966 B1 | 1/2001 | Kohno et al. | |
| 2010/0044768 A1* | 2/2010 | Sadd | ................. H01L 27/11519 257/314 |
| 2011/0062514 A1 | 3/2011 | Takano | |
| 2014/0084335 A1* | 3/2014 | Senoo | ................. H01L 29/0834 257/140 |
| 2015/0021656 A1 | 1/2015 | Kitagawa | |
| 2015/0221566 A1* | 8/2015 | Ookura | ............... H01L 29/7397 324/762.09 |

(Continued)

FOREIGN PATENT DOCUMENTS

| | | |
|---|---|---|
| JP | 2004-158680 A | 6/2004 |
| JP | 2010-238721 A | 10/2010 |

(Continued)

*Primary Examiner* — Moazzam Hossain
*Assistant Examiner* — Omar Mojaddedi

(57) ABSTRACT

In order to reduce electric field concentration in a semiconductor device including a main transistor section and a sense transistor section, the semiconductor device is provided, the semiconductor device including a semiconductor substrate of a first conductivity type, a main transistor section in an active region on the semiconductor substrate, and a sense transistor section outside the active region on the semiconductor substrate, wherein the active region is provided with a main well region of a second conductivity type, and wherein the sense transistor section has a sense gate trench section formed extending from the outside of the active region to the main well region on the front surface of the semiconductor substrate.

12 Claims, 20 Drawing Sheets

(56) References Cited

U.S. PATENT DOCUMENTS

2016/0079377 A1* 3/2016 Hutzler ................ H01L 29/407
                                                                                               257/334

FOREIGN PATENT DOCUMENTS

| JP | 2012-238773 A | 12/2012 |
| JP | 2013-105932 A | 5/2013 |

* cited by examiner

SEMICONDUCTOR DEVICE

The contents of the following Japanese patent applications are incorporated herein by reference:
NO. 2015-142191 filed in JP on Jul. 16, 2015, and
NO. 2015-183207 filed in JP on Sep. 16, 2015.

BACKGROUND

1. Technical Field

The present invention relates to a semiconductor device.

2. Related Art

Conventionally, in a semiconductor element, a constitution in which a sense element that detects a current flowing through a main transistor of an active region is provided has been known (refer to, for example, Patent Document 1).

PRIOR ART DOCUMENT

Patent Document 1: Japanese Patent Application Publication No. 2010-238721

In a semiconductor element, it is preferable to reduce electric field concentration.

SUMMARY

In one aspect of the present invention, a semiconductor device is provided, the semiconductor device including a semiconductor substrate of a first conductivity type, a main transistor section in an active region of the semiconductor substrate, and a sense transistor section outside the active region of the semiconductor substrate, wherein the active region is provided with a main well region of a second conductivity type, and wherein the sense transistor section has a sense gate trench section formed extending from the outside of the active region to the main well region on the front surface of the semiconductor substrate.

The summary clause does not necessarily describe all necessary features of the embodiments of the present invention. The present invention may also be a sub-combination of the features described above.

DESCRIPTION OF EXEMPLARY EMBODIMENTS

Hereinafter, embodiments of the present invention will be described. The embodiments do not limit the invention according to the claims, and all the combinations of the features described in the embodiments are not necessarily essential to means provided by aspects of the invention.

Figure 1:
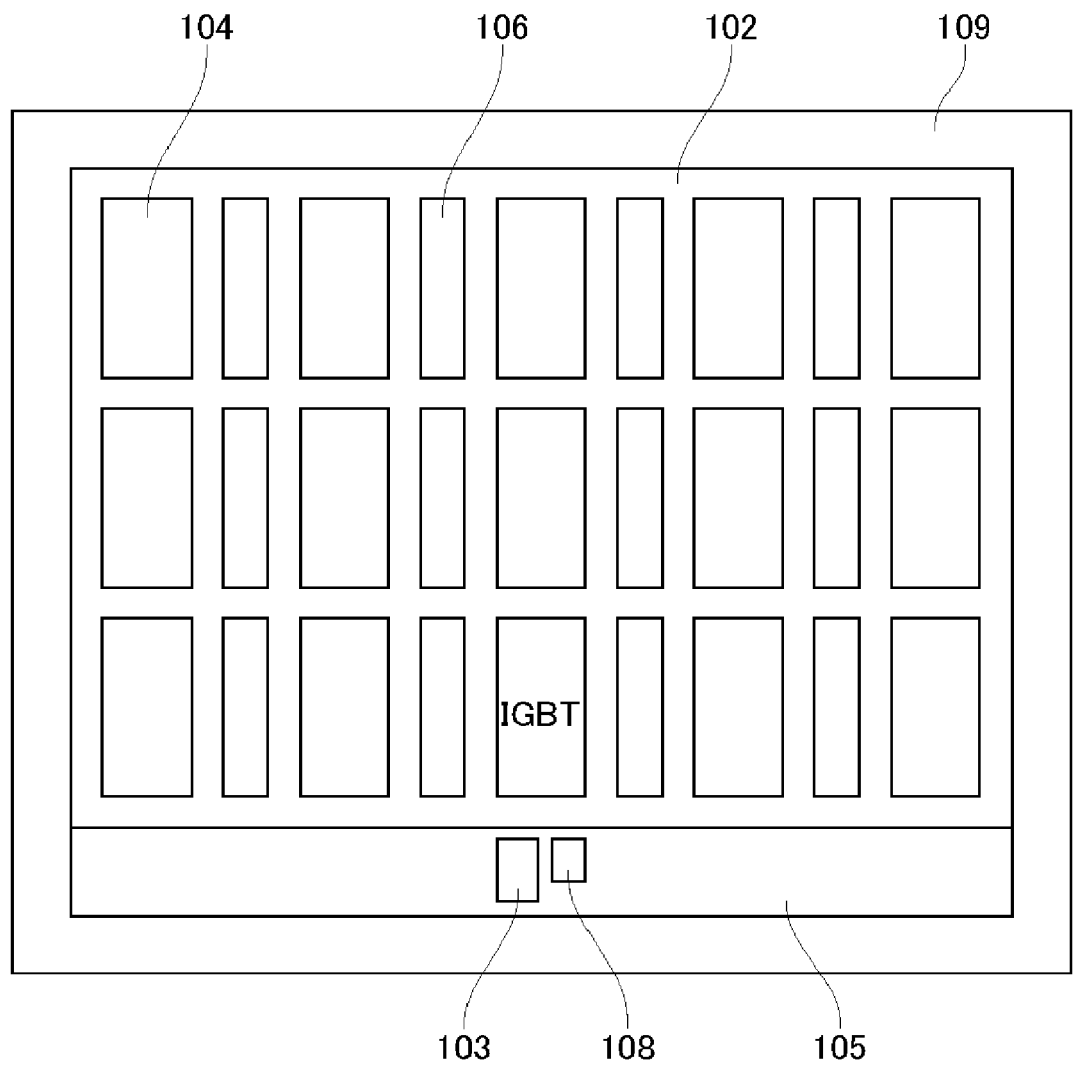
FIG. 1 is a plan view showing one example of a semiconductor device 100.

FIG. 1 is a plan view showing one example of a semiconductor device 100. The semiconductor device 100 is a semiconductor chip having a semiconductor substrate in which an active region 102 and an outer region 105 are formed. The semiconductor substrate has a first conductivity type. In the present example, the first conductivity type and a second conductivity type will be described as N-type and P-type, respectively. However, the first conductivity type may be P-type, and the second conductivity type may be N-type.

The active region 102 is a region through which a current flows when the semiconductor device 100 is driven, for example. The active region 102 is provided with a plurality of main transistor sections 104 and diode sections 106. The main transistor section 104 includes transistors such as IGBT (Insulated Gate Bipolar Transistor). The diode section 106 includes diodes such as FWD (Free Wheel Diode).

Each of the transistors included in the plurality of main transistor sections 104 is electrically provided in parallel with each other, and the same potential is applied to each terminal of gate, emitter, and collector. Each of the diodes included in the plurality of diode sections 106 is electrically provided in parallel with each other, and the same potential is applied to each terminal of emitter (or anode) and cathode.

The main transistor section 104 and the diode section 106 may be alternately arrayed along a predetermined array direction. Also, the plurality of main transistor sections 104 may be arrayed in a direction orthogonal to the above-described array direction. Also, the plurality of diode sections 106 may be arrayed in a direction orthogonal to the above-described array direction. A gate runner that transmits a gate potential may be provided between two main transistor sections 104 and between two diode sections 106.

The outer region 105 is provided outside the active region 102. The expression of "outside the active region 102" refers to a region which is not surrounded by the active region 102, and which is closer to an end portion of the semiconductor substrate 10 than the center of the active region 102. The outer region 105 may surround the active region 102. An edge termination structure 109 or the like may be provided further outside the outer region 105. The edge termination structure 109 reduces electric field concentration in the semiconductor substrate on its front surface side. The edge termination structure 109 has structures of a guard ring, a field plate, a RESURF (reduced surface field), and a combination thereof, for example. Also, a well region of the active region 102 and a well region of the outer region 105 are separated.

The outer region 105 is provided with a sense transistor section 108. The sense transistor section 108 detects a current flowing through the main transistor section 104. For example, a current flows through the sense transistor section 108, that is proportional to a main current flowing through the main transistor section 104, and is smaller than the main current. For example, the sense transistor section 108 is connected to the main transistor section 104 in parallel, and the same gate potential is input. However, a resistance greater than a resistance connected to the main transistor section 104 is connected to the sense transistor section 108.

The sense transistor section 108 is provided at a position that does not oppose the diode section 106. The sense transistor section 108 of the present example is provided at a position that opposes the main transistor section 104. A gate pad 103 may be formed adjacent to the sense transistor section 108. The area of the gate pad 103 may be larger than the area of the sense transistor section 108. The gate pad 103 and the sense transistor section 108 are both provided at a position that opposes the main transistor section 104.

Figure 2:
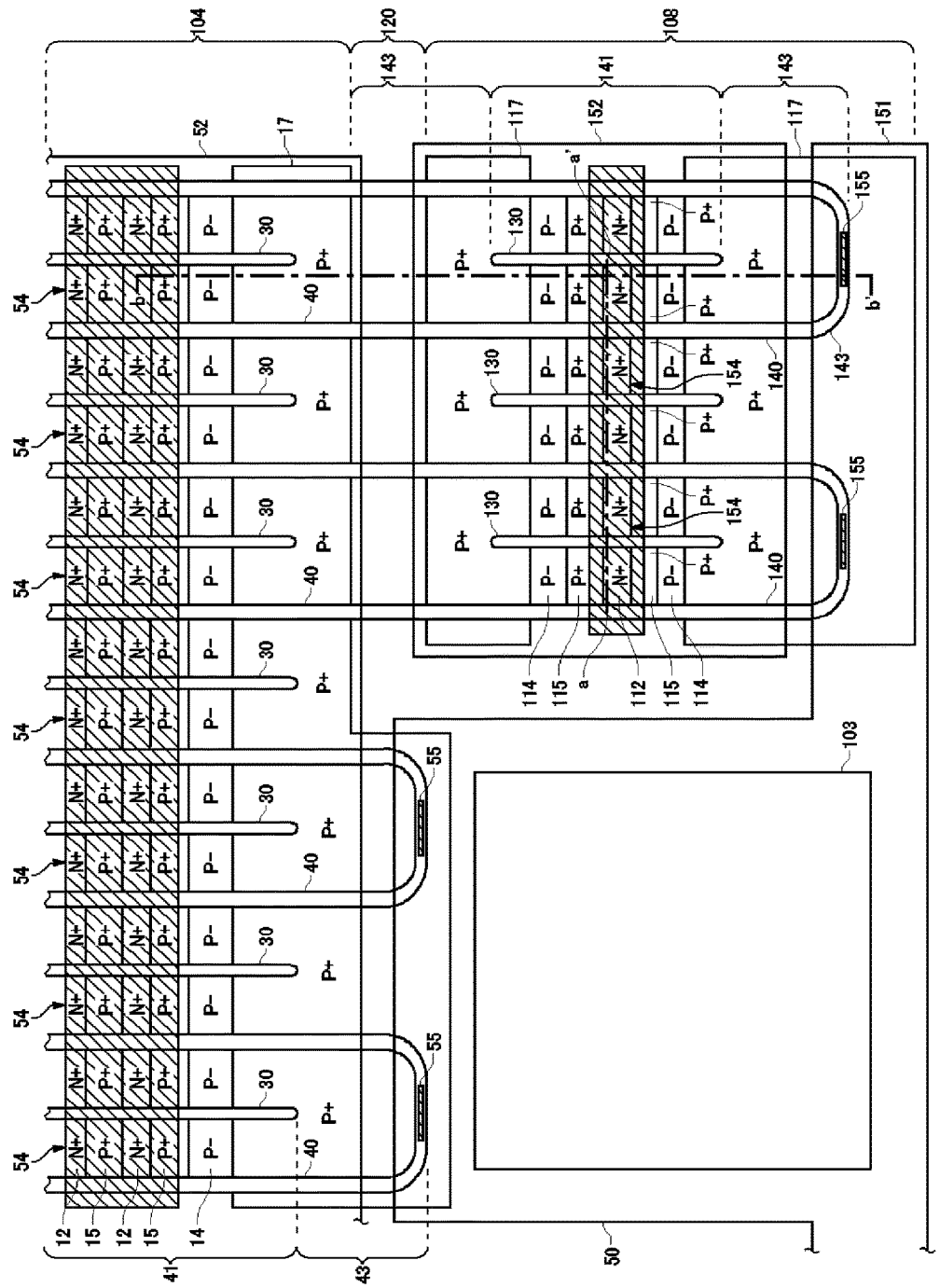
FIG. 2 is a plan view showing one example of a main transistor section 104 and a sense transistor section 108.

FIG. 2 is a plan view showing one example of the main transistor section 104 and the sense transistor section 108. FIG. 2 shows a portion where the main transistor section 104 opposes the gate pad 103 and the sense transistor section 108.

The active region 102 is provided with a main well region 17 of P+-type. The constitution of at least a part of the main transistor section 104 is formed in the main well region 17. For example, at least a part of the main gate trench section 40 of the main transistor section 104 is formed in the main well region 17. In addition, FIG. 2 and other drawings show end sides of the main well region 17, the main emitter electrode 52, and other elements along trench sections. However, the main well region 17, the main emitter electrode 52, and other elements may further extend along the array direction of the trench sections.

The sense transistor section 108 has a sense gate trench section 140. The sense gate trench section 140 is formed extending from the outer region 105 to the main well region 17 on the front surface of the semiconductor substrate. The main well region 17 may refer to a region which has a conductivity type different from that of the semiconductor substrate, and which is separated from a sense well region 117 by a well separation region 120 having the same conductivity type as that of the semiconductor substrate, for example. Also, the main well region 17 may refer to a region which is provided outside a base region 14 in the active region 102, and which has an impurity concentration higher than that of the base region 14.

The sense gate trench section 140 extends to the main well region 17 of the active region 102, so that the sense transistor section 108 can be prevented from floating with respect to the active region 102. For example, when a voltage applied to the active region 102 fluctuates greatly, the sense transistor section 108 can follow the voltage fluctuations via the sense gate trench section 140 extended to the main well region 17. For this reason, it is possible to reduce a voltage difference between the main transistor section 104 and the sense transistor section 108, and then reduce electric field concentration.

Also, the sense gate trench section 140 and the main gate trench section 40 may be electrically connected. Thereby, the sense gate trench section 140 can follow the voltage fluctuations in the main gate trench section 40 as well.

The sense gate trench section 140 of the present example extends to the main well region 17 to be connected, within the semiconductor substrate 10, to the main gate trench section 40 provided in the active region 102. That is, the sense gate trench section 140 and the main gate trench section 40 are consecutively formed.

In the example of FIG. 2, the main transistor section 104 that opposes the sense transistor section 108 has the main emitter electrode 52, the main gate trench section 40, a main dummy trench section 30, the main well region 17, an emitter region 12, the base region 14, a contact region 15, and a contact hole 54 in the chip on its front surface side. Also, the sense transistor section 108 has a gate electrode 151, a sense emitter electrode 152, the sense gate trench section 140, a sense dummy trench section 130, a sense well region 117, an emitter region 112, a base region 114, a contact region 115, a contact hole 154, and a contact hole 155 in the chip on its front surface side.

The main gate trench section 40, the main dummy trench section 30, the main well region 17, the emitter region 12, the base region 14, the contact region 15, the sense gate trench section 140, the sense dummy trench section 130, the sense well region 117, the emitter region 112, the base region 114, and the contact region 115 are formed within the semiconductor substrate on its front surface side. Also, the main emitter electrode 52, the sense emitter electrode 152, and the gate electrode 151 are provided over the front surface of the semiconductor substrate.

The main well region 17 of P+-type and the sense well region 117 of P+-type are formed separately. In the present example, the well separation region 120 having the same conductivity type as the semiconductor substrate (N−-type in the present example) is formed between the main well region 17 and the sense well region 117.

Although an interlayer insulating film is formed between the main emitter electrode 52, the sense emitter electrode 152 and the gate electrode 151, and the front surface of the semiconductor substrate, it is omitted in FIG. 2. The contact hole 54, the contact hole 154, and the contact hole 155 are formed penetrating through the interlayer insulating film. The main emitter electrode 52 is in contact with the semiconductor substrate through the contact hole 54. The sense emitter electrode 152 is in contact with the semiconductor substrate through the contact hole 154. The gate electrode 151 is in contact with the semiconductor substrate through the contact hole 155.

The main emitter electrode 52, the sense emitter electrode 152, and the gate electrode 151 are formed of a material containing a metal. For example, at least a part of a region of each electrode is formed of aluminum. Each electrode may have a region formed of a material containing tungsten.

One or more main gate trench sections 40 and one or more main dummy trench sections 30 are arrayed at a predetermined interval along a predetermined array direction in a region of the main transistor section 104. The main dummy trench section 30 is formed extending in a predetermined extending direction on the front surface of the semiconductor substrate. The main dummy trench section 30 in the present example has a linear shape, and is formed extending in a direction perpendicular to the above-described array direction.

The main gate trench section 40 is formed in parallel with the main dummy trench section 30. However, the main gate trench section 40 is longer than the main dummy trench section 30 in its extending direction.

One or more sense gate trench sections 140 and one or more sense dummy trench sections 130 are arrayed at a predetermined interval along a predetermined array direction in a region of the sense transistor section 108. The array direction and the interval of the trench sections in the sense transistor section 108 may be the same as the array direction and the interval of the trench sections in the main transistor section 104. The sense gate trench section 140 is provided at a position that opposes the main gate trench section 40, and the sense dummy trench section 130 is provided at a position that opposes the main dummy trench section 30.

The sense dummy trench section 130 is formed extending in a predetermined extending direction on the front surface of the semiconductor substrate. The extending direction of the trench sections in the sense transistor section 108 may be the same as the extending direction of the trench sections in the main transistor section 104. The sense dummy trench section 130 in the present example has a linear shape, and is formed extending in a direction perpendicular to the above-described array direction.

The sense gate trench section 140 is formed in parallel with the sense dummy trench section 130. However, the sense gate trench section 140 is longer than the sense dummy trench section 130 in its extending direction. The sense gate trench section 140 is formed from the sense well region 117 to the main well region 17 crossing the well separation region 120. The sense gate trench section 140 of the present example is connected to the main gate trench section 40 in the main well region 17.

An end portion of the sense dummy trench section 130 in the present example is formed in the sense well region 117. In another example, the sense dummy trench section 130 may extend to the main well region 17. The sense dummy trench section 130 may be connected to the main dummy trench section 30 that opposes the sense dummy trench section 130. In this case, the sense dummy trench section 130 is formed crossing the well separation region 120.

The diffusion depth of the main well region 17 may be deeper than the depths of the main gate trench section 40 and the main dummy trench section 30. The bottom of the end of the main dummy trench section 30 in its extending direction may be covered with the main well region 17. Also, the diffusion depth of the sense well region 117 may be deeper than the depths of the sense gate trench section 140 and the sense dummy trench section 130. The bottom of the end of the sense dummy trench section 130 in its extending direction may be covered with the sense well region 117.

The sense gate trench section 140 has an opposing section 141 and a protruding section 143. The opposing section 141 is formed extending in the above-described extending direction in a range that opposes the sense dummy trench section 130. That is, the opposing section 141 is formed in parallel with the sense dummy trench section 130.

The protruding section 143 is formed extending further from the opposing section 141 in a range that does not oppose the sense dummy trench section 130. The protruding section 143 is provided at both ends of the opposing section 141. The protruding section 143 closer to the main transistor section 104 extends to the main well region 17. Also, the protruding section 143 closer to an opposite side connects two opposing sections 141 provided at both sides of the sense dummy trench section 130. At least a part of the protruding section 143 may have a curved shape.

The contact hole 155 is formed in an insulating layer that covers the protruding section 143 which is on the side opposite from the main transistor section 104. The contact hole 155 may be formed in a region corresponding to the protruding section 143 farthest from the opposing section 141. In the protruding section 143 of the present example, a region farthest from the opposing section 141 has a portion extending in a direction orthogonal to the opposing section 141. The contact hole 155 may be formed corresponding to the portion of the protruding section 143.

The gate electrode 151 is formed covering a part of the protruding section 143 which is closer to the side opposite from the main transistor section 104. The gate electrode 151 is formed covering a portion in the protruding section 143 where the contact hole 155 is provided. The gate electrode 151 of the present example is not formed over the opposing section 141 and the sense dummy trench section 130.

The main emitter electrode 52 is formed over the main gate trench section 40, the main dummy trench section 30, the main well region 17, the emitter region 12, the base region 14, and the contact region 15. One end of the main emitter electrode 52 of the present example is provided over the well separation region 120. The protruding section 143 may be formed in its entirety in the sense well region 117.

The base region 14 is formed in the regions of the main transistor section 104 sandwiched by each trench section. The base region 114 is formed in the regions of the sense transistor section 108 sandwiched by each trench section. The conductivity type of the base regions 14 and 114 is P$^-$-type having an impurity concentration lower than that of the main well region 17 and the sense well region 117.

The contact regions 15 and 115 of P$^+$-type having an impurity concentration higher than that of the base regions 14 and 114 are formed on the front surface of the base regions 14 and 114. Also, the emitter regions 12 and 112 of N$^+$-type having an impurity concentration higher than that of the semiconductor substrate are selectively formed in a part on the front surface of the contact regions 15 and 115.

The contact regions 15 and 115 and the emitter regions 12 and 112 are each formed from one adjacent trench section to the other trench section. One or more contact regions and one or more emitter regions are formed in the region sandwiched by each trench section so as to be alternately exposed on the front surface of the semiconductor substrate along the extending direction of the trench sections. The number of repetition times of the contact region 115 and the emitter region 112 in the sense transistor section 108 may be lower than the number of repetition times of the contact region 15 and the emitter region 12 in the main transistor section 104.

In the main transistor section 104 and the sense transistor section 108, the contact holes 54 and 154 are formed over each region of the contact regions, the emitter regions, and the dummy trench sections. In order to maximize the contact areas between the emitter regions and the emitter electrodes, the contact holes 54 and 154 are formed from one adjacent trench section to the other trench section. Also, the contact holes 54 and 154 may be formed so as to expose the entire front surface of the emitter regions. Also, the contact holes 54 and 154 may be formed to expose the entire front surface of the contact regions as well. However, the contact holes 54 and 154 are not formed in regions corresponding to the base regions and the well regions.

Also, the contact holes 54 and 154 are formed over the gate trench sections in a range that opposes the emitter regions as well. The contact holes 54 and 154 of the present example expose the gate trench sections in a range that opposes the emitter regions and the contact regions. In addition, as will be described later, insulating sections that insulate the electrodes within the trenches and the emitter electrodes are formed at an upper end within the trenches of the gate trench sections.

Also, the contact holes 54 and 154 are formed so as to expose the dummy trench sections in a range that opposes the emitter regions. The contact holes 54 and 154 of the present example expose the dummy trench sections in a range that opposes the emitter regions and the contact regions. The emitter electrodes are in contact with the electrodes within the exposed dummy trench sections.

In the semiconductor device 100 of the present example, the gate pad 103 is formed adjacent to the sense transistor section 108. The area of the gate pad 103 may be larger than the area of the region of the sense transistor section 108 where the IGBT is formed. The gate pad 103 and the sense transistor section 108 are both provided at positions that oppose the main transistor section 104.

The main gate trench section 40 that opposes the gate pad 103 may have a shape different from that of the main gate trench section 40 that opposes the sense transistor section 108. In the present example, the main gate trench section 40 that opposes the gate pad 103 is not connected to the sense gate trench section 140. The main gate trench section 40 that opposes the gate pad 103 has the opposing section 41 and the protruding section 43.

The structure of the opposing section 41 and the structures of the main emitter electrode 52, the main well region 17, the contact hole 54, the emitter region 12, the contact region 15, and the base region 14 which correspond to the opposing section 41 are similar to the structure of the main gate trench section 40 or the like that opposes the sense transistor section 108. The main emitter electrode 52, the main well region 17, and the contact hole 54 may be consecutively formed in both a region that opposes the gate pad 103 and a region that opposes the sense transistor section 108.

The opposing section 41 is provided at a position that opposes the main dummy trench section 30. The protruding section 43 is provided extending from the opposing section 41, and is provided at a position that does not oppose the main dummy trench section 30. In the present example, the entire protruding section 43 is formed in the main well region 17.

The protruding section 43 connects two opposing sections 41 provided at both sides of the main dummy trench section 30. The protruding section 43 has a portion that extends in substantially parallel with the array direction of the trench sections in a region farthest from the main dummy trench section 30. The portion of the protruding section 43 is provided in a region covered with the gate electrode 50. The semiconductor device 100 further includes a contact hole 55 provided corresponding to the portion of the protruding section 143.

The gate electrode 50 may be integrally formed with the gate electrode 151 provided corresponding to the sense transistor section 108. The gate pad 103 is formed in a part of regions of the gate electrode 50 and the gate electrode 151.

The gate electrode 50 is in contact with electrodes formed within the trenches of the protruding section 43 through the contact hole 55. Thereby, the main gate trench section 40 that opposes the gate pad 103 and the gate electrode 50 are connected.

Figure 3:
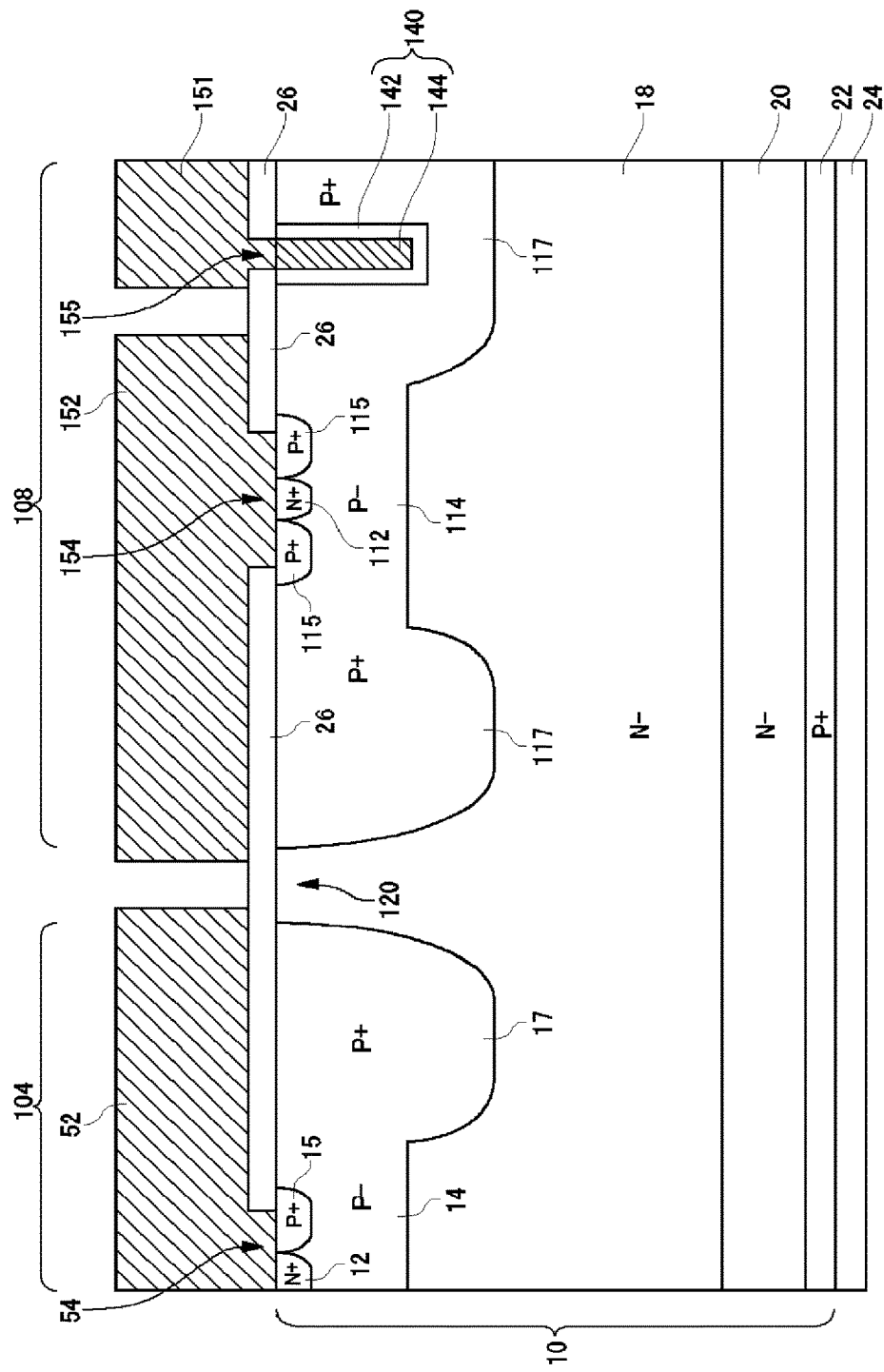
FIG. 3 shows one example of a cross-section along b-b' in FIG. 2.

FIG. 3 shows one example of the cross-section along b-b' in FIG. 2. The semiconductor device 100 of the present example has the semiconductor substrate 10, an interlayer insulating film 26, a main emitter electrode 52, a sense emitter electrode 152, a gate electrode 151, and a collector electrode 24 in the cross-section thereof. The interlayer insulating film 26 is formed between the main emitter electrode 52, the sense emitter electrode 152 and the gate electrode 151, and the semiconductor substrate 10. The contact holes 54, 154, and 155 are formed in the interlayer insulating film 26.

The semiconductor substrate 10 has the sense well region 117 and the main well region 17 in the cross-section thereof. The base region 14 and the base region 114 are formed in a region surrounded by the main well region 17, and a region surrounded by the sense well region 117, respectively. The drift region 18 of $N^-$-type is formed in the sense well region 117, the main well region 17, and the base regions 14 and 114 on their rear surface sides.

A buffer region 20 of $N^-$-type is formed in the drift region 18 on its rear surface side. A collector region 22 of $P^+$-type is formed in the buffer region 20 on its rear surface side. The collector electrode 24 is formed in the collector region 22 on its rear surface side. Also, in the present specification, one surface of each member such as a substrate, a layer, and a region closer to the sense emitter electrode 152 is referred to as the front surface, and the other surface of the same closer to the collector electrode 24 is referred to as the rear surface or the bottom section. Also, a direction which couples the sense emitter electrode 152 and the collector electrode 24 is referred to as the depth direction.

Also, the main well region 17 and the sense well region 117 are separated by the well separation region 120. The well separation region 120 is formed extending from the drift region 18, and is exposed on the front surface of the semiconductor substrate 10 passing between the main well region 17 and the sense well region 117. Thereby, the current is prevented from flowing between the main transistor section 104 and the sense transistor section 108.

Meanwhile, the sense gate trench section 140 shown in FIG. 2 is formed within the main well region 17 crossing the well separation region 120. For this reason, the sense well region 117 can be prevented from turning into floating with respect to the main well region 17. For example, the main well region 17 and the electrode within the sense gate trench section 140 are capacitive-coupled, and the electrode within the sense gate trench section 140 and the sense well region 117 are capacitive-coupled. For this reason, when large voltage fluctuations are generated in the main well region 17, the sense well region 117 can follow the voltage fluctuations via the sense gate trench section 140.

Also, the sense gate conductive section 144 of the sense gate trench section 140 and the main gate conductive section 44 of the main gate trench section 40 are electrically connected. For this reason, the sense gate trench section 140 can follow the voltage fluctuations of the main gate trench section 40 as well. For this reason, electric field concentration in the end portion of the main well region 17 can be reduced.

The contact hole 54 exposes at least a part of the emitter region 12 and the contact region 15 on the front surface of the semiconductor substrate 10. The main emitter electrode 52 passes through the contact hole 54, and is in contact with the emitter region 12 and the contact region 15.

The contact hole 154 exposes at least a part of the emitter region 112 and the contact regions 115 on the front surface of the semiconductor substrate 10. The sense emitter electrode 152 passes through the contact hole 54 and is in contact with the emitter region 112 and the contact regions 115.

The contact hole 155 exposes at least a part of the protruding section 143 of the sense gate trench section 140 on the front surface of the semiconductor substrate 10. The sense gate trench section 140 has an insulating film 142 formed on an inner wall of the sense gate trench and a sense gate conductive section 144 filled within the sense gate trench inside the insulating film 142.

At least a part of the front surface of the sense gate conductive section 144 is exposed by the contact hole 155. The gate electrode 151 passes through the contact hole 155, and is in contact with the front surface of the sense gate conductive section 144. As will be described later, a sense gate insulating section that insulates the sense emitter electrode 152 and the sense gate conductive section 144 is formed in the vicinity of the upper end of the sense gate trench. However, in the sense gate trench section 140 exposed by the contact hole 155, the sense gate insulating section is not formed, and at least a part of the front surface of the sense gate conductive section 144 is exposed.

The sense gate trench section 140 exposed by the contact hole 155 may have the same cross-section structure as that of the sense dummy trench section 130 which will be described later. For example, in a part of the protruding section 143, at least a part of an end surface of the sense gate conductive section 144 closer to an opening of the gate trench (the front surface in the present example) has the same height as the front surface of the semiconductor substrate 10. The entire front surface of the sense gate conductive section 144 may have the same height as the front surface of the semiconductor substrate 10.

Also, the gate trench of the sense gate trench section 140 exposed by the contact hole 155 may be shallower than the gate trench of the sense gate trench section 140 in the opposing section 141. That is, the sense gate trench of the opposing section 141 is deeper than a part of the sense gate trench of the protruding section 143. The sense gate trench of the sense gate trench section 140 exposed by the contact hole 155 may be formed at the same depth as the sense dummy trench which will be described later. Also, the gate trench of the sense gate trench section 140 exposed by the contact hole 155 may have the same width as the sense dummy trench. By such a constitution, unevenness of the front surface of the semiconductor substrate 10 can be decreased.

However, the structure of the sense gate trench section 140 is not limited to the example of FIG. 3. For example, the sense gate trench section 140 may have an insulating section provided over the sense gate conductive section 144 within the sense gate trench. In a region exposed by the contact hole 155, the insulating section may have a through hole. The gate electrode 151 may contact the sense gate conductive section 144 through the through hole.

Figure 4:
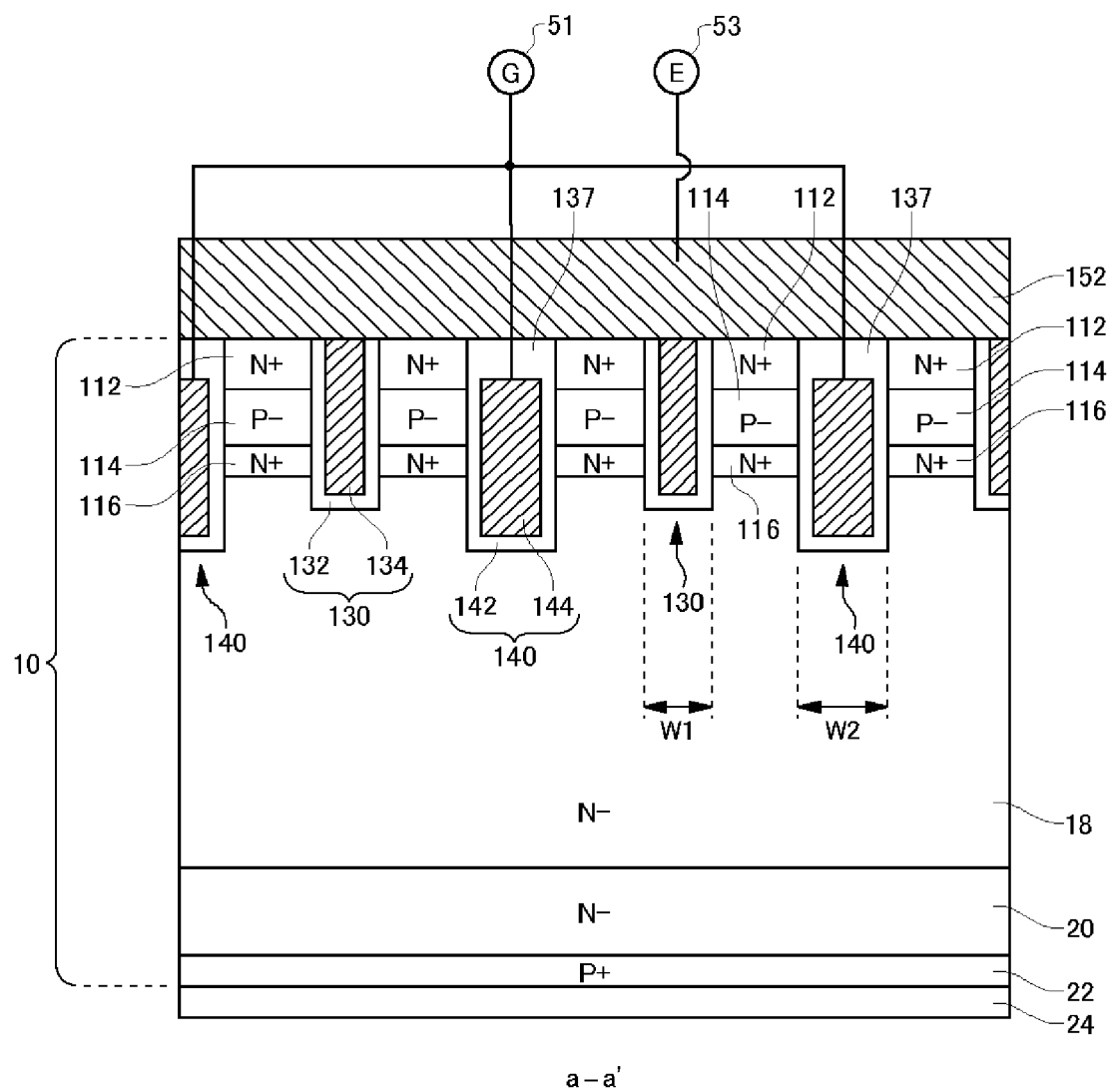
FIG. 4 shows one example of the cross-section along a-a' in FIG. 2.

FIG. 4 shows one example of the cross-section along a-a' in FIG. 2. The cross-section along a-a' is a cross-section in the sense transistor section 108. Although the structure of the sense transistor section 108 will be described in FIG. 4, the main transistor section 104 also has the similar structure in a cross-section parallel with the cross-section along a-a'.

The semiconductor device 100 of the present example has the semiconductor substrate 10, the sense emitter electrode 152, and the collector electrode 24 in the cross-section. The sense emitter electrode 152 is formed on the front surface of the semiconductor substrate 10. The sense emitter electrode 152 is electrically connected to the emitter terminal 53. The emitter terminal 53 may be electrically connected to the main emitter electrode 52 as well.

The collector electrode 24 is formed on the rear surface of the semiconductor substrate 10. The collector electrode 24 is electrically connected to the collector terminal. The collector electrode 24 is formed of a conductive material such as a metal. The collector electrode 24 may be provided as an integral electrode for the main transistor section 104, the sense transistor section 108, and the diode section 106.

The semiconductor substrate 10 may be a silicon substrate, and may also be a silicon carbide substrate, a nitride semiconductor substrate, or the like. The base region 114 of $P^-$-type is formed in the semiconductor substrate 10 on its front surface side. Also, the emitter region 112 of $N^+$-type is selectively formed in a part of a region of the base region 114 on its front surface side. In the main transistor section 104, the emitter region 12 and the base region 14 are formed instead of the emitter region 112 and the base region 114. The emitter regions 12 and 112 are separated from each other. Also, the base regions 14 and 114 are separated from each other.

Also, the semiconductor substrate 10 further has an accumulation region 116 of $N^+$-type, the drift region 18 of $N^-$-type, the buffer region 20 of $N^-$-type, and the collector region 22 of $P^+$-type. The drift region 18, the buffer region 20, and the collector region 22 are consecutively formed in both the main transistor section 104 and the sense transistor section 108. Also, in the diode section 106, a cathode region of $N^+$-type is formed instead of the collector region 22.

The accumulation region 116 is formed in the base region 114 on its rear surface side. The impurity concentration of the accumulation region 116 is higher than the impurity concentration of the drift region 18. The accumulation region 116 in the main transistor section 104 is formed separately from the accumulation region 116 of the sense transistor section 108.

The accumulation region 116 is formed between adjacent trenches. For example, in the sense transistor section 108, the accumulation region 116 is formed between the sense dummy trench section 130 and the sense gate trench section 140. The accumulation region 116 may be provided so as to cover the entire region between the sense dummy trench section 130 and the sense gate trench section 140. A carrier injection enhancement effect (IE effect) can be increased, and an on-voltage can be decreased by providing the accumulation region 116.

The drift region 18 is formed in the accumulation region 116 on its rear surface side. The buffer region 20 is formed in the drift region 18 on its rear surface side. The impurity concentration of the buffer region 20 is higher than the impurity concentration of the drift region 18. The buffer region 20 may function as a field stop layer that prevents a depletion layer spreading from the rear surface side of the base region 114 from reaching the collector region 22. The collector region 22 is formed in the buffer region 20 on its rear surface side. Also, the collector electrode 24 is provided on the rear surface of the collector region 22.

One or more sense gate trench sections 140 and one or more sense dummy trench sections 130 are formed in the semiconductor substrate 10 on its front surface side in the cross-section. Each trench section penetrates through the base region 114 from the front surface of the semiconductor substrate 10 and reaches the drift region 18. In the present example, the sense gate trench section 140 and the sense dummy trench section 130 reach the drift region 18, penetrating through the emitter region 112, the base region 114, and the accumulation region 116 from the front surface of the semiconductor substrate 10.

The sense gate trench section 140 has a sense gate trench, the insulating film 142, the sense gate conductive section 144, and the sense gate insulating section 137 which are formed in the semiconductor substrate 10 on its front surface side. The insulating film 142 is formed covering the inner wall of the sense gate trench. The insulating film 142 may be formed by oxidizing or nitrogenating the semiconductor on the inner wall of the sense gate trench. The sense gate conductive section 144 is formed inside the insulating film 142 within the sense gate trench. That is, the insulating film 142 insulates the sense gate conductive section 144 and the semiconductor substrate 10. The sense gate conductive section 144 is formed of a conductive material such as polysilicon.

The sense gate insulating section 137 is formed over the sense gate conductive section 144 within the sense gate trench, and insulates the sense gate conductive section 144 and the sense emitter electrode 152. In the present example, an end surface of the sense gate conductive section 144 closer to an opening of the sense gate trench is provided closer to the inside of the semiconductor substrate 10 than the front surface of the semiconductor substrate 10. Here, the front surface of the semiconductor substrate 10 may refer to a front surface of the emitter region 112. Also, there are cases where the end surface of the sense gate conductive section 144 closer to the opening of the sense gate trench is referred to as the front surface of the sense gate conductive section 144.

The sense gate insulating section 137 is filled within the sense gate trench on the upper side of the front surface of the sense gate conductive section 144. The sense gate insulating section 137 is provided covering the entire front surface of the sense gate conductive section 144. At least a part of an end surface of the sense gate insulating section 137 closer to the opening of the sense gate trench is provided at the same height as the front surface of the semiconductor substrate 10. In addition, there are cases where the end surface of the sense gate insulating section 137 closer to the sense gate trench is referred to as the front surface of the sense gate insulating section 137.

The front surface of the sense gate insulating section 137 is in contact with the sense emitter electrode 152. It is preferable that no other conductive member or insulating member is interposed between the sense gate insulating section 137 and the sense emitter electrode 152. In this way, unevenness on the front surface of the semiconductor substrate 10 can be decreased by forming the sense gate insulating section 137 within the sense gate trench.

Also, the entire front surface of the sense gate insulating section 137 may be formed on the same surface as the front surface of the semiconductor substrate 10. In this case, unevenness of the front surface of the semiconductor substrate 10 can be further decreased. Therefore, the structure laminated over the front surface of the semiconductor substrate 10 can be easily formed. Also, the semiconductor device 100 is miniaturized easily.

The sense gate insulating section 137 includes, for example, a silicon oxide, a silicon nitride, or other insulating materials. The thickness of the sense gate insulating section 137 in its depth direction may be greater than the thickness of the insulating film 142 in the sense gate trench bottom section.

The sense gate conductive section 144 at least includes a region that opposes the base regions 114 adjacent thereto. Each sense gate conductive section 144 is electrically connected to the gate terminal 51. The gate terminal 51 may be the gate pad 103. In the present example, the sense gate conductive section 144 is electrically connected to the gate electrode 151 in the protruding section 143 as shown in FIG. 2. Also, the gate electrode 151 is electrically connected to the gate terminal 51. If a predetermined voltage is applied to the sense gate conductive section 144 via the gate terminal 51, a channel is formed in the surface layer of the interface that is in contact with the sense gate trench in the base region 114.

The sense dummy trench section 130 has a sense dummy trench, the insulating film 132 and the sense dummy conductive section 134, all of which are formed in the semiconductor substrate 10 on its front surface side. The insulating film 132 is formed covering the inner wall of the sense dummy trench.

The sense dummy conductive section 134 is formed within the sense dummy trench, and is formed inside the insulating film 132. The insulating film 132 insulates the sense dummy conductive section 134 and the semiconductor substrate 10. The sense dummy conductive section 134 may be formed of the same material as the sense gate conductive section 144. For example, the sense dummy conductive section 134 is formed of a conductive material such as polysilicon. The sense dummy conductive section 134 may have the same length as the sense gate conductive section 144 in its depth direction.

The sense emitter electrode 152 is in contact with the sense dummy conductive section 134 within the sense dummy trench. The expression of "within the sense dummy trench" includes an opening of the sense dummy trench. That is, at least a part of an end surface of the sense dummy conductive section 134 closer to an opening of the sense dummy trench has the same height as the front surface of the semiconductor substrate 10, and the sense emitter electrode 152 may be in contact with the end surface of the sense dummy conductive section 134 having the same height as the front surface of the semiconductor substrate 10. In addition, there are cases where the end surface of the sense dummy conductive section 134 closer to the opening of the sense dummy trench is referred to as the front surface of the sense dummy conductive section 134.

Also, in the semiconductor substrate 10 on its front surface side, an opening width W2 of the sense gate trench is larger than an opening width W1 of the sense dummy trench. Here, the expression of "the opening width" may refer to a maximum width of the widths in the opening. When the opening is in a circular shape, the opening width refers to a diameter in the circular shape. The length of the sense gate trench can be made longer than that of the sense dummy trench when the sense gate trench and the sense dummy trench are formed in the same etching step, by increasing the opening width W2 of the sense gate trench. For this reason, the sense gate trench and the sense dummy trench having different lengths can be easily formed.

Also, in the example of FIG. 4, the front surface of the sense dummy conductive section 134 is provided at the same position as the opening of the sense dummy trench. In another example, the front surface of the sense dummy conductive section 134 may be provided at a deeper position within the semiconductor substrate 10 than the opening of the sense dummy trench. In this case, the sense emitter electrode 152 is formed within the sense dummy trench, and is in contact with the front surface of the sense dummy conductive section 134.

Also, the insulating film 132 may not be formed in the vicinity of the end portion of the sense dummy trench closer to the front surface of the substrate. Thereby, at least a part of the emitter region 112 is exposed in a side wall of the sense dummy trench. The insulating film 132 may be formed by oxidizing or nitrogenating the semiconductor of the inner wall of the sense dummy trench, and forming the sense dummy conductive section 134 having a predetermined thickness within the sense dummy trench, and then removing the oxide or nitride film not covered with the sense dummy conductive section 134.

In this case, the sense emitter electrode 152 is in contact with the front surface of the sense dummy conductive section 134 within the sense dummy trench as well, and is also in contact with the emitter region 112 in the side wall of the sense dummy trench. Thereby, the contact area of the emitter region 112 and the sense emitter electrode 152 can be enlarged, and the contact resistance can be decreased.

In the present example, the sense gate trench sections 140 and the sense dummy trench sections 130 are alternately arranged in a predetermined array direction as shown in FIG. 4. Also, each trench section may be arranged at regular intervals. However, the arrangement of each trench section is not limited to the above-described example. A plurality of sense gate trench sections 140 may be arranged between two sense dummy trench sections 130. Also, the number of the sense gate trench sections 140 provided between each pair of the sense dummy trench sections 130 may not be the same.

In addition, the sense gate trench of the sense gate trench section 140 may be formed at a position deeper than the sense dummy trench of the sense dummy trench section 130. Thereby, even if the sense gate conductive section 144 and the sense dummy conductive section 134 are formed in the same length and in the same process, the sense dummy conductive section 134 can be filled within the sense dummy trench while ensuring a space to provide the sense gate insulating section 137 within the sense gate trench.

The structures of the sense gate trench section 140 and the sense dummy trench section 130 have been described above. As described above, however, the main gate trench section 40 and the main dummy trench section 30 also have structures similar to those of the sense gate trench section 140 and the sense dummy trench section 130.

The main gate trench section 40 has a main gate trench, an insulating film, and a main gate conductive section. The shape, size, position, material and the like of the main gate trench, the insulating film, and the main gate conductive section in the cross-section parallel with the cross-section along a-a' may be the same as those of the sense gate trench, the insulating film 142, and the sense gate conductive section 144 in the cross-section along a-a'.

The main dummy trench section 30 has a main dummy trench, an insulating film, and a main dummy conductive section. The shape, size, position, material and the like of the main dummy trench, the insulating film, and the main dummy conductive section in the cross-section parallel with the cross-section along a-a' may be the same as those of the sense dummy trench, the insulating film 132, and the sense dummy conductive section 134 in the cross-section along a-a'.

That is, the main gate trench may be formed at a position deeper than the dummy trench. The width of the main gate trench may be larger than that of the dummy trench. At least a part of an end surface of the main dummy conductive section closer to an opening of the main dummy trench has the same height as the front surface of the semiconductor substrate 10, and the main emitter electrode may be in contact with the end surface of the main dummy conductive section. At least a part of an end surface of the main gate insulating section closer to an opening of the main gate trench has the same height as the front surface of the semiconductor substrate 10, and the main emitter electrode may be in contact with the end surface of the main gate insulating section.

The main transistor section 104 has the main emitter electrode 52, the emitter region 12, the base region 14, the accumulation region 116, the drift region 18, the buffer region 20, the collector region 22, and the collector electrode 24 in the cross-section in parallel with the cross-section along a-a'. The shape, size, position, material, and the like of the main emitter electrode 52, the emitter region 12, the base region 14, the accumulation region 116, the drift region 18, the buffer region 20, the collector region 22, and the collector electrode 24 in the cross-section in parallel with the cross-section along a-a' may be the same as those of the sense emitter electrode 152, the emitter region 112, the base region 114, the accumulation region 116, the drift region 18, the buffer region 20, the collector region 22, and the collector electrode 24 in cross-section along a-a'.

According to the semiconductor device 100 of the present example, the IE effect on the drift region can be increased and the on-voltage can be decreased by providing the main dummy trench section 30 and the sense dummy trench section 130. Also, unevenness on the front surface of the semiconductor substrate 10 can be decreased by providing the gate insulating section inside the gate trench. Also, unevenness on the front surface of the semiconductor substrate 10 can be decreased by bringing the emitter electrode and the dummy conductive section into direct contact with each other. For this reason, the semiconductor device 100 can be miniaturized easily.

Also, in the semiconductor device 100 of the present example, the dummy conductive sections within the trenches of the main dummy trench section 30 and the sense dummy trench section 130 are in direct contact with the main emitter electrode 52 and the sense emitter electrode 152, respectively. That is, other conductive materials such as polysilicon are not provided between the dummy conductive section and the emitter electrode. For this reason, unevenness of the front surface of the semiconductor substrate 10 can be decreased. Also, the entire front surface of the dummy conductive section may have the same height as the surface of the semiconductor substrate 10. In this case, unevenness of the front surface of the semiconductor substrate 10 can be further decreased. Therefore, the structure laminated over the front surface of the semiconductor substrate 10 can be easily formed.

Also, the semiconductor device 100 may not have an insulating film on the front surface of the emitter region 12 and the emitter region 112 in the mesa region between the gate trench section and the dummy trench section. That is, the front surface of the emitter region in the mesa region may all be in contact with the emitter electrode. When the insulating film is provided over each trench section, the insulating film covers a part of the front surface of the emitter region of the mesa region. Also, the size of the insulating film has manufacturing tolerance. For this reason, it is difficult to miniaturize the semiconductor device and narrow a mesa width. Meanwhile, according to the semiconductor device 100, the insulating film may not be provided on the front surface of the emitter region in the mesa region, and thus the semiconductor device 100 can be further miniaturized.

In addition, the structure of each trench section is not limited to the example shown in FIG. 4. The gate trench section and the dummy trench section may be formed at the same depth and width. Also, the insulating film that covers each trench section may be formed on the front surface of the semiconductor substrate 10, and the conductive material such as poly silicon connected to the conductive section within each trench may also be formed.

Next, one example of the method of manufacturing the semiconductor device 100 shown in FIG. 1 to FIG. 4 will be described. However, the method of manufacturing the semiconductor device 100 is not limited to the present example. First, the semiconductor substrate 10 having the same conductivity type as the drift region 18 is prepared (will be described as N$^-$-type in the present example).

Next, an etching mask of a predetermined pattern is provided on the front surface of the semiconductor substrate 10, and a plurality of trenches for the main gate trench section 40, the main dummy trench section 30, the sense gate trench section 140, and the sense dummy trench section 130 is formed. After the trench is formed, the insulating film is formed in the inner wall of the trench. Then, the conductive material is filled within the trench.

Next, P-type impurities are injected into the semiconductor substrate from its front surface side, and the semiconductor substrate is thermally treated for approximately two hours at a temperature of approximately 1100 degrees, and then P-type base regions 14 and 114 which are shallower than the trenches are formed on the entire front surface of the semiconductor substrate 10. Next, N-type impurities are injected into the semiconductor substrate 10 from its front surface side, and then an N-type accumulation region 116 which is deeper than the base region and shallower than the trench is formed. For example, the N-type accumulation region 116 is formed by ion-implanting phosphorus at an accelerating voltage of approximately 2.8 MeV, and at $5.0 \times 10^{12}/cm^2$.

Next, N-type impurities are selectively injected into the semiconductor substrate 10 from its front surface side using a mask having therein opening portions corresponding to the emitter regions 12 and 112. Thereby, N$^+$-type emitter regions 12 and 112 are selectively formed within P-type base regions 14 and 114.

After that, the interlayer insulating film 26 is formed in the semiconductor substrate 10 on its front surface side. The interlayer insulating film 26 is formed over the conductive section in the trench as well. The interlayer insulating film 26 formed within the gate trench functions as a gate insulating section.

Also, the contact hole is formed in each interlayer insulating film 26. Moreover, an emitter electrode and a gate electrode are formed. Next, after selenium is ion-implanted at, for example, approximately $1.0 \times 10^{14}/cm^2$ into the semiconductor substrate 10 from its rear surface side, the semiconductor substrate 10 is thermally treated for approximately two hours at a temperature of approximately 900 degrees. Thereby, a buffer region 20 of N$^+$-type is formed in the semiconductor substrate 10 on its rear surface side. A remained region of N$^-$-type of the semiconductor substrate 10 is the drift region 18. The buffer region 20 can be formed at a deep position by using selenium having a high diffusion coefficient. Also, the semiconductor substrate 10 may be polished to adjust the thickness before the buffer region 20 is formed.

The N$^+$-type buffer region 20 may be formed by ion-implanting proton a plurality of times at different dosages, instead of ion implantation of selenium. Thereby, the buffer region 20 in which the impurity concentration increases in the substrate from its front surface side to its rear surface side can be formed.

Next, P-type impurities are ion-implanted at a dosage of, for example, $1.0 \times 10^{13}/cm^2$ or more and $4.0 \times 10^{13}/cm^2$ or less from the rear surface side of the semiconductor substrate 10. Thereby, the P$^+$-type collector region 22 which is thinner than the buffer region 20 is formed in the semiconductor substrate 10 on its rear surface side. When a dosage of the P-type impurities is less than $1.0 \times 10^{13}/cm^2$, the collector region and the collector electrode cannot form an ohmic junction, and thus this dosage is not preferable.

Figure 5:
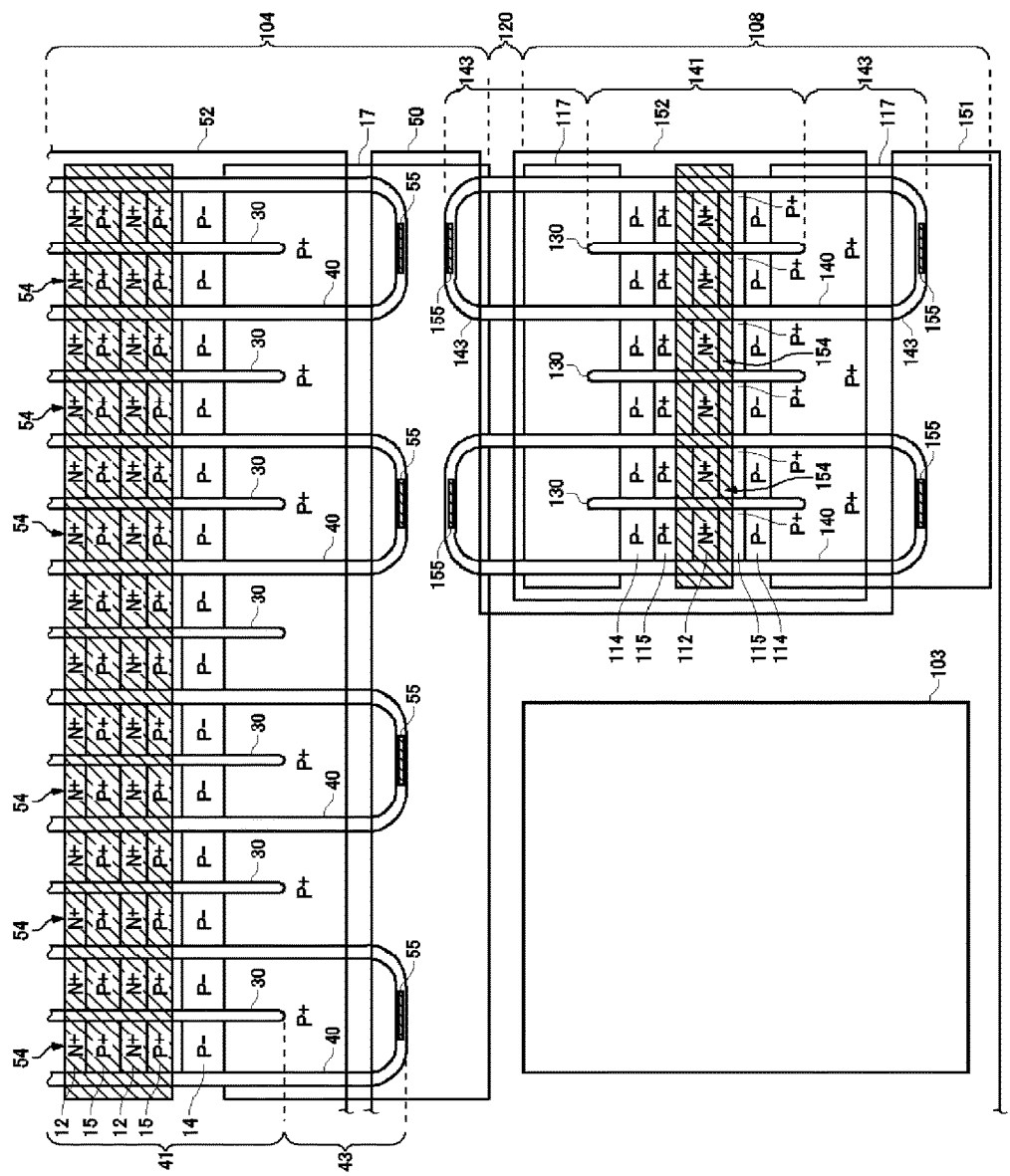
FIG. 5 is a plan view showing another example of the main transistor section 104 and the sense transistor section 108.

FIG. 5 is a plan view showing another example of the main transistor section 104 and the sense transistor section 108. The main transistor section 104 in the present example is provided in the active region 102, and has the main gate trench section 40 separated from the sense gate trench section 140 within the semiconductor substrate 10. The main gate trench section 40 has the opposing section 41 and the protruding section 43.

The opposing section 41 is provided at a position that opposes the main dummy trench section 30. The protruding section 43 is provided extending from the opposing section 41 and is provided at a position that does not oppose the main dummy trench section 30. The entire protruding section 43 in the present example is formed in the main well region 17. The protruding section 43 may have the same shape as that of the protruding section 143. The protruding section 43 connects two opposing sections 41 at both sides of the main dummy trench section 30.

Also, a contact hole 55 is provided corresponding to a part of the protruding section 43. The contact hole 55 may be provided in a region of the protruding section 43 closest to the sense transistor section 108. The protruding section 43 has a portion that extends in substantially parallel with the array direction of the trench section in a region closest to the sense transistor section 108. The contact hole 55 may be formed corresponding to the portion.

The semiconductor device 100 of the present example has the gate electrode 50 at a position that covers the contact holes 55. At least a part of the gate electrode 50 is formed over the main well region 17. The entire gate electrode 50 may be formed over the main well region 17. The same potential as the gate electrode 151 may be applied to the gate electrode 50. The gate electrode 50 may be formed of the same material as the gate electrode 151.

The protruding section 143 of the sense gate trench section 140 closer to the main transistor section 104 extends into the main well region 17. However, the protruding section 143 of the present example is not connected to the main gate trench section 40. The protruding section 143 connects two opposing sections 141 at both sides of the sense dummy trench section 130. The protruding section 143 has a portion extending in substantially parallel with the array direction of the trench section in a region closest to the main gate trench section 40. The portion of the protruding section 143 is provided in a region covered with the gate electrode 50. The semiconductor device 100 may be further provided with the contact hole 155 provided corresponding to the portion of the protruding section 143.

The contact hole 155 exposes the sense gate conductive section 144 at the portion of the protruding section 143. The gate electrode 50 is in contact with the sense gate conductive section 144 through the contact hole 155. That is, the gate electrode 50 is in contact with both the main gate conductive section 44 and the sense gate conductive section 144. Thereby, the main gate conductive section 44 and the sense gate conductive section 144 are electrically connected. By also such a constitution, the sense transistor section 108 can be caused to follow the voltage fluctuations of the main transistor section 104.

Also, the gate pad 103 may be formed adjacent to the sense transistor section 108. The gate pad 103 may be the same as the gate pad 103 shown in FIG. 2. In the example shown in FIG. 5, the main gate trench section 40 that opposes the gate pad 103 and the main gate trench section 40 that opposes the sense transistor section 108 may have the same structure. Also, the structure of the main gate trench section 40 that opposes the gate pad 103 may have the same structure as the main gate trench section 40 that opposes the gate pad 103 shown in FIG. 2. Any of the main gate trench sections 40 is provided separately from the sense gate trench section 140 within the semiconductor substrate 10.

The gate electrode 50 may be integrally formed with the gate electrode 151 provided corresponding to the sense transistor section 108. The gate electrode 50, the main emitter electrode 52, the main well region 17, and the contact hole 54 may be consecutively formed in both the region that opposes the gate pad 103 and the region that opposes the sense transistor section 108.

Figure 6:
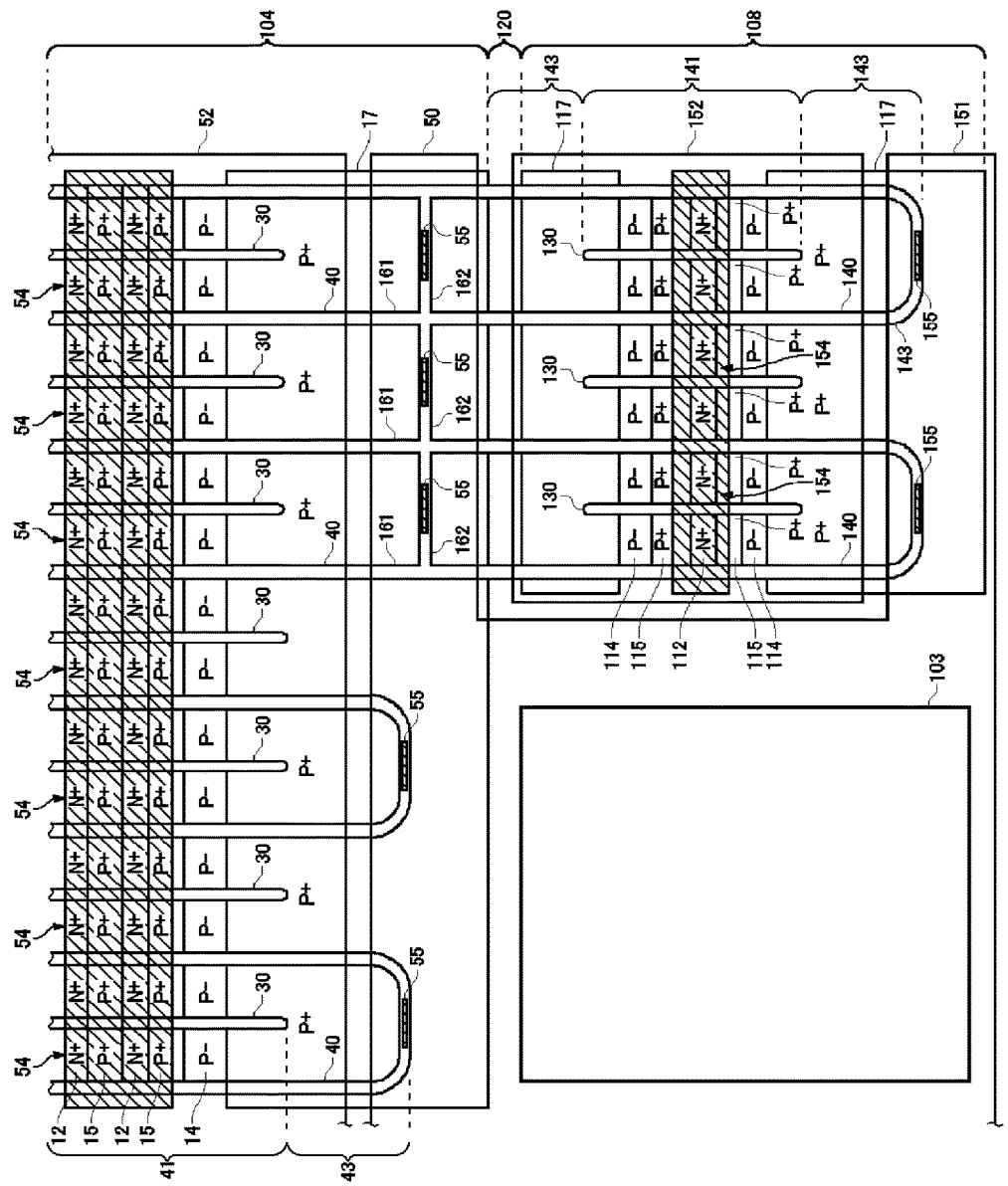
FIG. 6 is a plan view showing another example of the main transistor section 104 and the sense transistor section 108.

FIG. 6 is a plan view showing another example of the main transistor section 104 and the sense transistor section 108. In the present example, the main gate trench section 40 that opposes the sense transistor section 108 has a plurality of the first trench sections 161 and one or more second trench sections 162. The first trench section 161 is provided extending in a predetermined direction. The first trench section 161 of the present example is provided in parallel with the main dummy trench sections 30. Also, the first trench section 161 is connected to the sense gate trench section 140.

The second trench section 162 is provided extending in a direction different from the extending direction of the first trench section 161. The second trench section 162 of the present example extends in a direction orthogonal to the first trench section 161. The second trench section 162 connects two adjacent first trench sections 161. The second trench section 162 may be formed in the main well region 17.

The second trench section 162 may be formed between each pair of the first trench sections 161. As shown in FIG. 6, the second trench section 162 may be provided to connect three or more first trench sections 161.

The second trench section 162 is provided below the gate electrode 50. The interlayer insulating film 26 between the second trench sections 162 and the gate electrode 50 is provided with the contact hole 55. The contact hole 55 exposes the front surface of the main gate conductive section 44 in the second trench section 162. The main gate insulating section is not formed in at least the portion of the second trench section 162. The main gate insulating section may not be formed across the entire second trench sections 162. The gate electrode 50 is in contact with the front surface of the main gate conductive section 44 through the contact hole 55. By also such a constitution, the sense transistor section 108 can be caused to follow the voltage fluctuations of the main transistor section 104.

In addition, the second trench section 162 may be formed shallower than the first trench section 161. The second trench section 162 may be formed at the same depth as the main dummy trench section 30. The second trench section 162 may be formed thinner than the first trench section 161. The second trench section 162 may be formed at the same thickness as the main dummy trench section 30.

Also, the gate pad 103 may be formed adjacent to the sense transistor section 108. The gate pad 103 may be the same as the gate pad 103 shown in FIG. 2. In the example shown in FIG. 6, the main gate trench section 40 that opposes the gate pad 103 and the main gate trench section 40 that opposes the sense transistor section 108 have different shapes from each other. In the present example, the main gate trench section 40 that opposes the gate pad 103 is separated from the sense gate trench section 140 within the semiconductor substrate 10, and the main gate trench section 40 that opposes the sense transistor section 108 is connected to the sense gate trench section 140 within the semiconductor substrate 10.

The gate electrode 50 may be integrally formed with the gate electrode 151 provided corresponding to the sense transistor section 108. The gate electrode 50, the main emitter electrode 52, the main well region 17, and the contact hole 54 may be consecutively formed in both the region that opposes the gate pad 103 and the region that opposes the sense transistor section 108.

Figure 7:
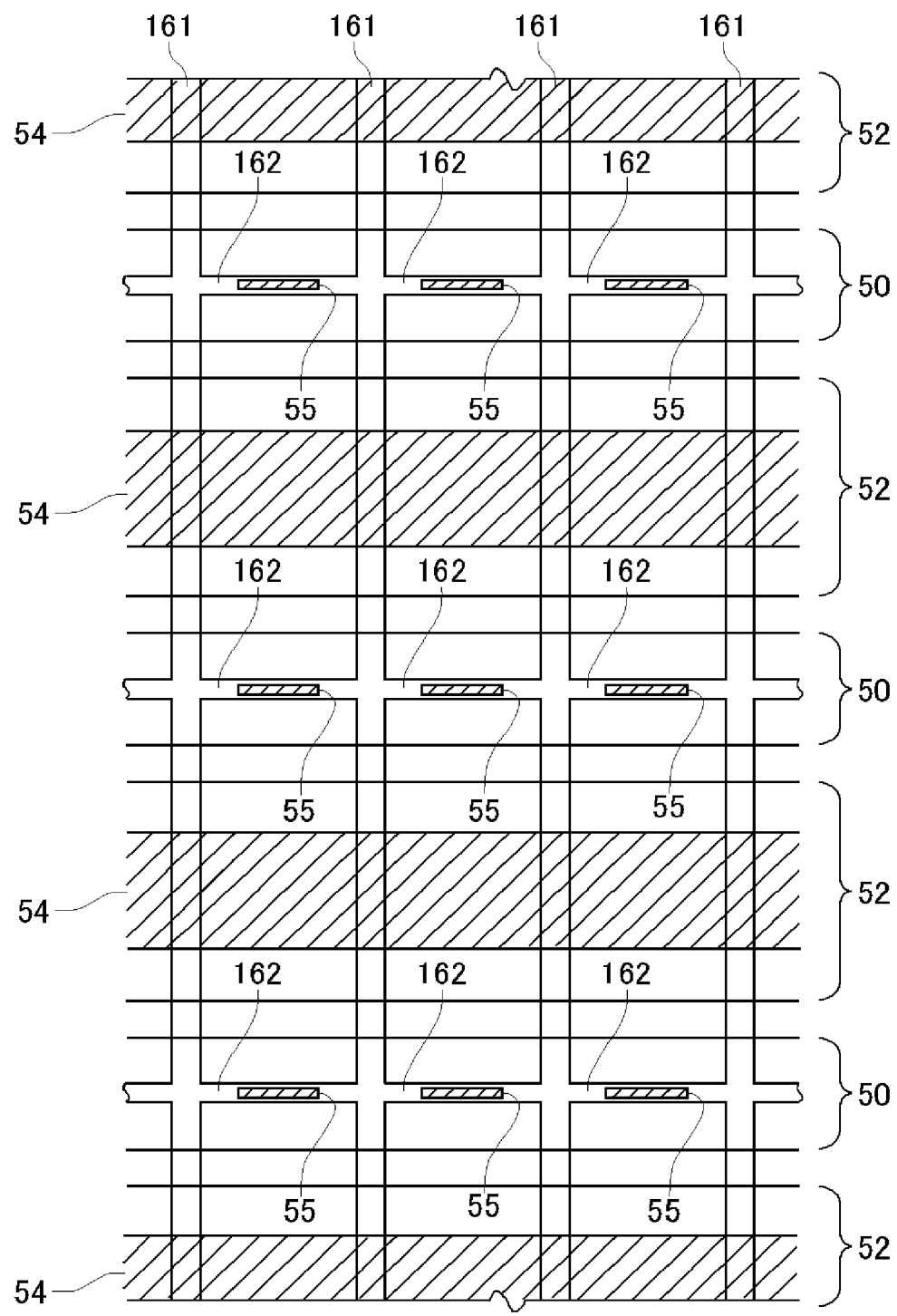
FIG. 7 is a plan view showing one example of a main gate trench section 40.

FIG. 7 is a plan view showing one example of the main gate trench section 40. FIG. 7 partially shows the main gate trench section 40. In FIG. 7, the main dummy trench section 30 is omitted. The main gate trench section 40 of the present example has a first trench section 161 and a second trench section 162. The second trench sections 162 are formed at a predetermined interval in the extending direction of the first trench section 161.

The semiconductor device 100 has one or more gate electrodes 50 passing over each second trench section 162. The contact hole 55 is provided for each second trench section 162. The gate electrode 50 is in contact with the second trench sections 162 through the contact hole 55.

Also, the gate electrode 50 is provided crossing over the plurality of first trench sections 161 and functions as a gate runner transmitting a gate potential in the array direction of the trench section. The same potential is applied to each gate electrode 50. The main emitter electrode 52 is provided between each of the gate electrodes 50.

The main well region 17 may be formed around the second trench sections 162. The base region 14, the contact region 15, and the emitter region 12 may be formed between each of the second trench sections 162. The main emitter electrode 52 is in contact with the base region 14, the contact region 15, the emitter region 12, and the first trench section 161 through the contact hole 54.

Also, the main dummy trench section 30 may be formed within a region surrounded by the first trench section 161 and the second trench section 162. The main dummy trench section 30 and the second trench section 162 are provided separately. By such a constitution, a uniform gate potential can be applied to the main gate trench section 40.

Figure 8:
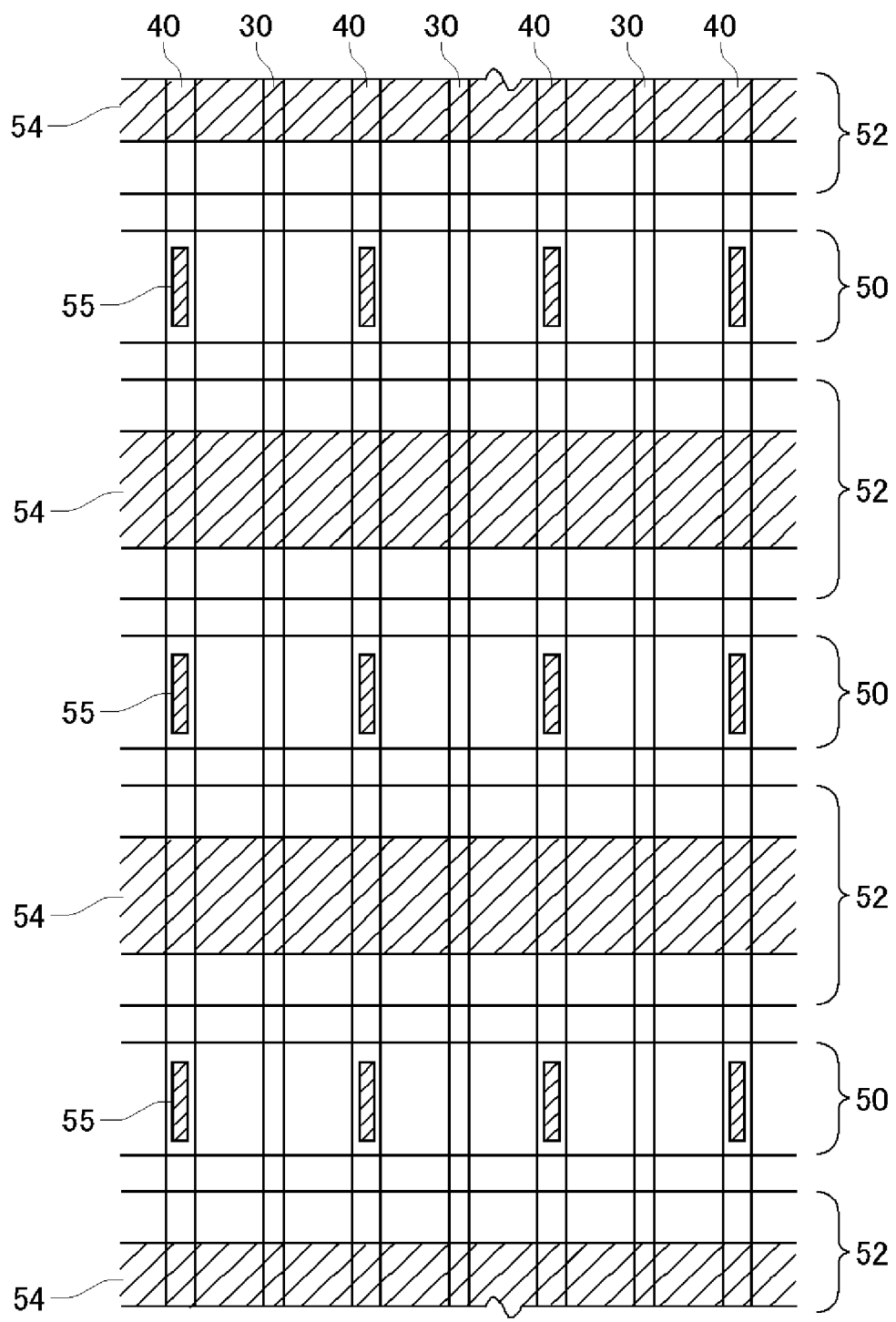
FIG. 8 is a plan view showing another example of the main gate trench section 40.

FIG. 8 is a plan view showing another example of the main gate trench section 40. FIG. 8 partially shows the main gate trench section 40. The semiconductor device 100 of the present example has a plurality of gate electrodes 50 arranged discretely in the extending direction of the trench section. The same potential is applied to each gate electrode 50. The main emitter electrode 52 is provided between each pair of the gate electrodes 50.

Each gate electrode 50 is provided crossing over the plurality of main gate trench sections 40 and the plurality of main dummy trench sections 30. The interlayer insulating film 26 is provided between the gate electrode 50 and each trench section. The contact hole 55 is provided in the interlayer insulating film 26 between the gate electrode 50 and the main gate trench section 40. The gate electrode 50 is in contact with the main gate conductive section 44 through the contact hole 55.

The main gate trench section 40 below the contact hole 55 is not provided with the main gate insulating section. The main gate trench section 40 below the contact hole 55 may be formed shallower than the main gate trench section 40 of other regions. The main gate trench section 40 below the contact hole 55 may be formed thinner than the main gate trench section 40 of other regions. With such a constitution, a uniform gate potential can be applied to the main gate trench section 40.

Figure 9:
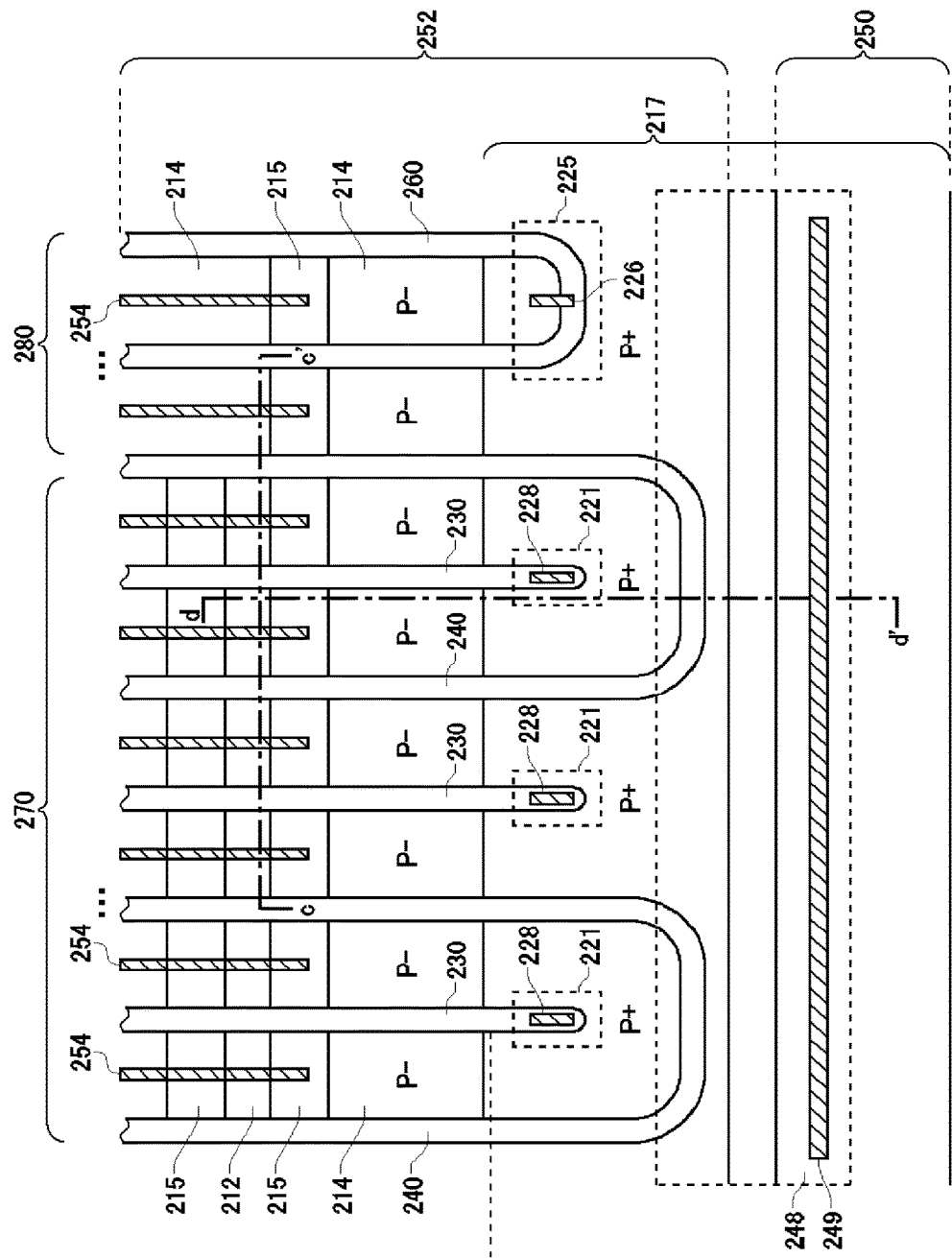
FIG. 9 shows a constitution of a semiconductor device 200 according to a comparative example.

FIG. 9 shows the constitution of the semiconductor device 200 according to a comparative example. The semiconductor device 200 has a transistor section 270 and a diode section 280. Also, the semiconductor device 200 has a gate electrode 250, an emitter electrode 252, a gate trench section 240, a dummy trench section 230, an emitter trench section 260, a well region 217, an emitter region 212, a base region 214, a contact region 215, contact holes 226, 228, 249, and 254, and polysilicon layers 221, 225, and 248 on its front surface side.

Figure 10:
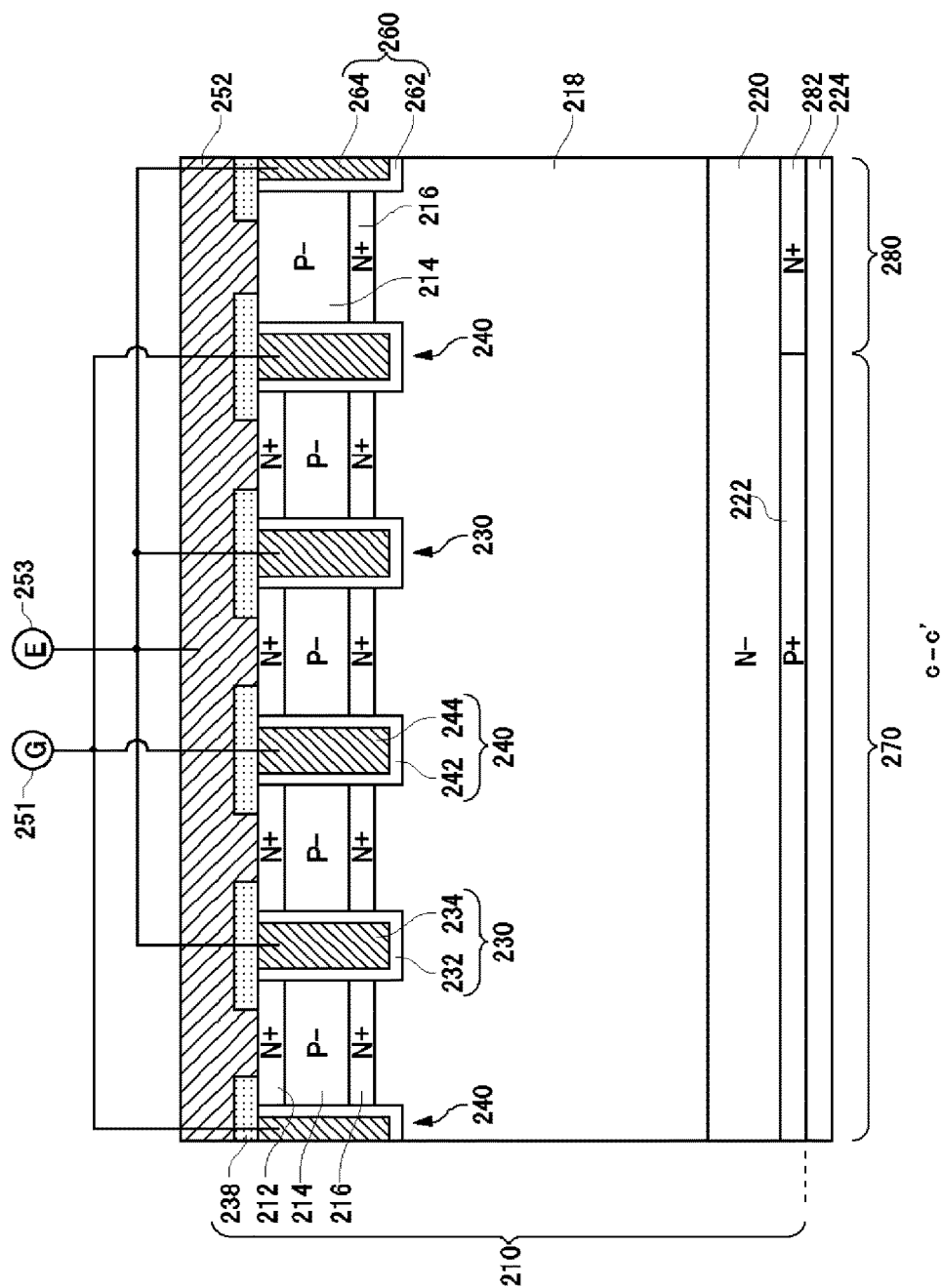
FIG. 10 shows a cross-section along c-c' in FIG. 9.

FIG. 10 shows a cross-section along c-c' in FIG. 9. The semiconductor device 200 has a semiconductor substrate 210, the emitter electrode 252, an insulating section 238, and a collector electrode 224 in the cross-section. The emitter electrode 252 is electrically connected to an emitter terminal 253.

In the semiconductor substrate 210, the gate trench section 240, the dummy trench section 230, the emitter trench section 260, the emitter region 212, the base region 214, an accumulation region 216, a drift region 218, a buffer region 220, a collector region 222, and a cathode region 282 are formed. The gate trench section 240 has an insulating film 242 and a gate conductive section 244. The gate conductive section 244 is electrically connected to a gate terminal 251. The dummy trench section 230 has an insulating film 232 and a dummy conductive section 234. The emitter trench section 260 has an insulating film 262 and an emitter conductive section 264.

The insulating section 238 is provided covering each of the gate trench sections 240, the dummy trench sections 230, and the emitter trench sections 260 on the front surface of the semiconductor substrate 10. However, the insulating section 238 exposes at least a part of the front surface of the emitter region 212 in the mesa region between the gate trench section 240 and the dummy trench section 230. The emitter electrode 252 is in contact with the front surface of the emitter region 212.

The area of the emitter region 212 not covered with the insulating section 238 changes depending on the manufacturing tolerance of the insulating section 238. For this reason, in order to expose at least a part of the emitter region 212, the manufacturing tolerance of the insulating section 238 must be taken into consideration. Particularly, in the present example, the insulating section 238 is formed at both sides of the mesa region, and thus the width of the mesa region is affected by the tolerance of the insulating section 238 at both sides. For this reason, if the semiconductor device 200 is miniaturized, it is difficult to reliably expose the emitter region 212, and thus it is difficult to miniaturize the semiconductor device 200. Meanwhile, according to the semiconductor device 100 shown in FIG. 4, the insulating film that covers the main gate trench section 40 and the main dummy trench section 30 is not provided on the front surface of the semiconductor substrate 10, and thus the emitter region 12 and the main emitter electrode 52 can be in contact with each other even if the semiconductor device 100 is miniaturized.

Also, in the semiconductor device 200, patterning on the insulating section 238 is performed on the front surface of the semiconductor substrate 210. For this reason, unevenness is formed on the front surface of the semiconductor substrate 210. Meanwhile, in the semiconductor device 100 shown in FIG. 4, the insulating section 238 is not provided on the front surface of the semiconductor substrate 10, and thus unevenness on the surface of the semiconductor substrate 10 can be decreased.

Figure 11:
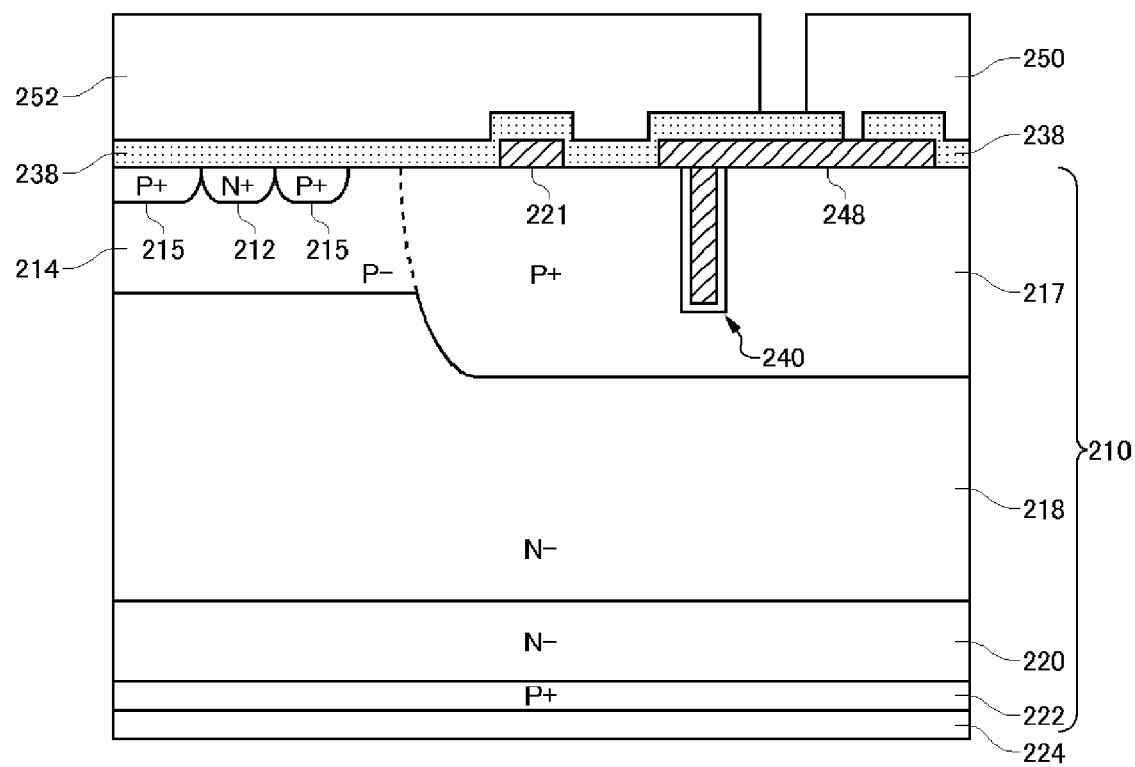
FIG. 11 shows the cross-section along d-d' in FIG. 9.

FIG. 11 shows the cross-section along d-d' in FIG. 9. The semiconductor device 200 is provided with the semiconductor substrate 210, the emitter electrode 252, the gate electrode 250, the collector electrode 224, the polysilicon layer 221, the polysilicon layer 248, and the insulating section 238 on the cross-section.

The polysilicon layer 221 and the polysilicon layer 248 are formed on the front surface of the semiconductor substrate 210, and they connect the conductive section within each trench and either of the emitter electrode 252 or the gate electrode 250. The semiconductor device 200 selectively has a polysilicon layer 221 and a polysilicon layer 248 on the front surface of the semiconductor substrate 210. For this reason, unevenness is generated on the front surface of the semiconductor substrate 210, and thus it is not easy to form a layer such as the insulating section 238 to be formed over the front surface of the semiconductor substrate 210.

Meanwhile, according to the semiconductor device 100 shown in FIG. 3 and FIG. 4, the main emitter electrode 52 is brought into direct contact with the conductive section within each trench, and thus the polysilicon layer may not be formed on the front surface of the semiconductor substrate 10. For this reason, unevenness on the front surface of the semiconductor substrate 10 can be decreased.

Figure 12:
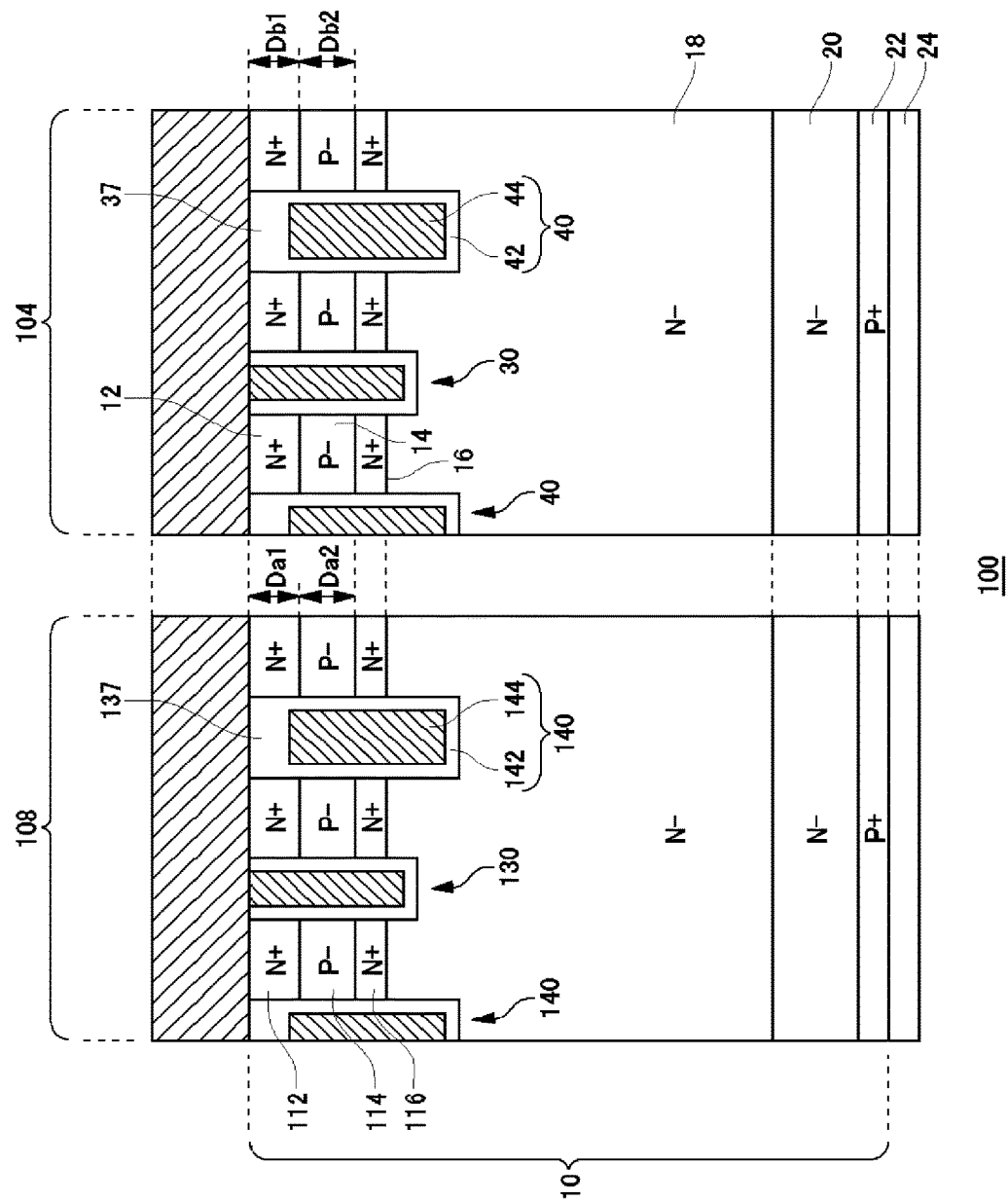
FIG. 12 shows a cross-section of the semiconductor device 100 according to a second embodiment.

FIG. 12 shows a cross-section of the semiconductor device 100 according to the second embodiment. In the semiconductor device 100 of the present example, a threshold voltage of the sense transistor section 108 is higher than a threshold voltage of the main transistor section 104. More specifically, the length Da1 of the emitter region 112 in the sense transistor section 108 in the depth direction is shorter than the length Db1 of the emitter region 12 in the main gate trench section 40 in the depth direction.

The base region 114 in the sense transistor section 108 and the base region 14 in the main transistor section 104 are formed at the same depth. However, the emitter region 112 and the emitter region 12 have different lengths in the depth direction, and thus the length Da2 of the base region 114 adjacent to the sense gate trench section 140 is longer than the length Db2 of the base region 14 adjacent to the main gate trench section 40.

The length of the base region adjacent to the gate trench corresponds to a channel length. For this reason, by the above-described structure, the threshold voltage of the sense transistor section 108 is higher than the threshold voltage of the main transistor section 104. As a result, the rise of the sense transistor section 108 at turn-on is slower than the rise of the main transistor section 104 at turn-on, and thus the generation of a surge current in the sense transistor section 108 can be suppressed. As a result, a protection circuit or the like using the sense transistor section 108 can be operated stably.

In the present example, the main gate trench section 40 is formed at a position deeper than the sense gate trench section 140. However, the main gate conductive section 44 and the sense gate conductive section 144 have the same length in the depth direction. As a result, the position on the top surface of the main gate conductive section 44 is deeper than the position on the top surface of the sense gate conductive section 144.

As will be described later, the emitter region 12 in the main gate trench section 40 can be formed at a position deeper than the emitter region 112 in the sense transistor section 108 by injecting and diffusing the N-type impurities into the side wall of the gate trench by using each gate conductive section as a mask. By such a manufacturing method, transistors having different threshold values can be easily formed.

In addition, a main gate trench and a sense gate trench having different depths may be formed by performing etching on the front surface of the semiconductor substrate 10 using masks having a plurality of openings with different areas. When the opening area of the mask is large, a deep gate trench can be formed. Thereby, the threshold voltages of each transistor section can be adjusted while the gate trenches 48 having different depths can be formed simultaneously to make the manufacturing step more efficient. In addition, the structures of other portions in the semiconductor device 100 of the present example may be the same as those of any of the semiconductor devices 100 illustrated in FIG. 1 to FIG. 8.

Figure 13:
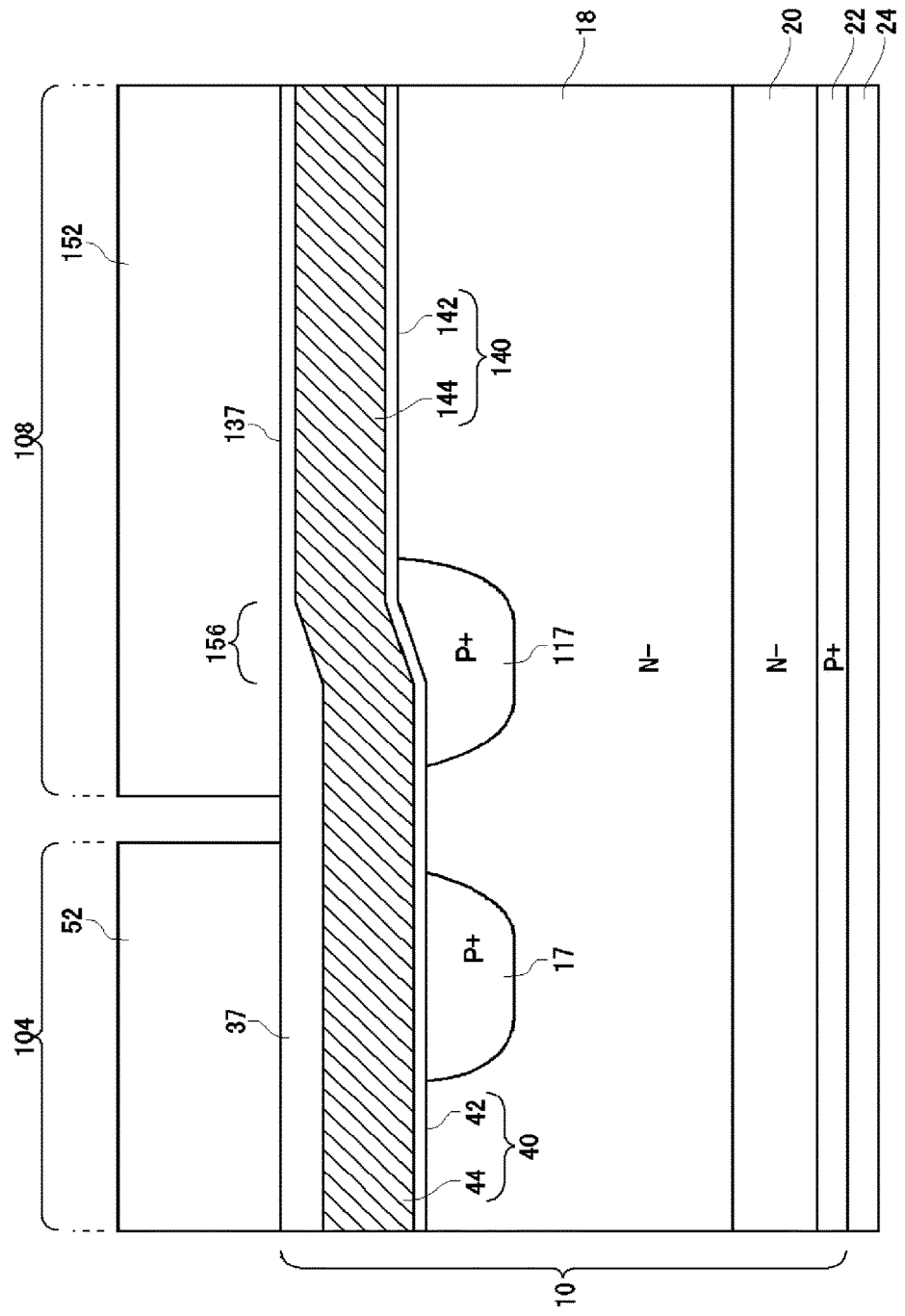
FIG. 13 shows a cross-section along a gate trench when the structure shown in FIG. 12 is applied to the semiconductor device 100 shown in FIG. 2 or FIG. 6.

FIG. 13 shows a cross-section along the gate trench when the structure shown in FIG. 12 is applied to the semiconductor device 100 shown in FIG. 2 or FIG. 6. As illustrated in FIG. 12, in the semiconductor device 100 of the present example, the depths and the widths of the main gate trench section 40 and the sense gate trench section 140 are different. Meanwhile, in the semiconductor device 100 shown in FIG. 2 or FIG. 6, the main gate trench section 40 and the sense gate trench section 140 are connected.

The semiconductor device 100 of the present example has a connection gate trench section 156 that connects the main gate trench section 40 and the sense gate trench section 140. One end of the connection gate trench section 156 is connected to the main gate trench section 40 and the other end of the connection gate trench section 156 is connected to the sense gate trench section 140. The depth and the width of the connection gate trench section 156 gradually changes from one end to the other end. By such a structure, it is possible to avoid a rapid change of the structure and prevent electric field concentration. Also, the connection gate trench section 156 has an insulating section that connects the main gate insulating section 37 and the sense gate insulating section 137. The thickness of the insulating section also gradually changes.

In addition, it is preferable that the connection gate trench section 156 is formed in either one or both of the sense well region 117 and the main well region 17. The connection gate trench section 156 can be protected by surrounding the connection gate trench section 156 by the well region having a high concentration.

Figure 14:
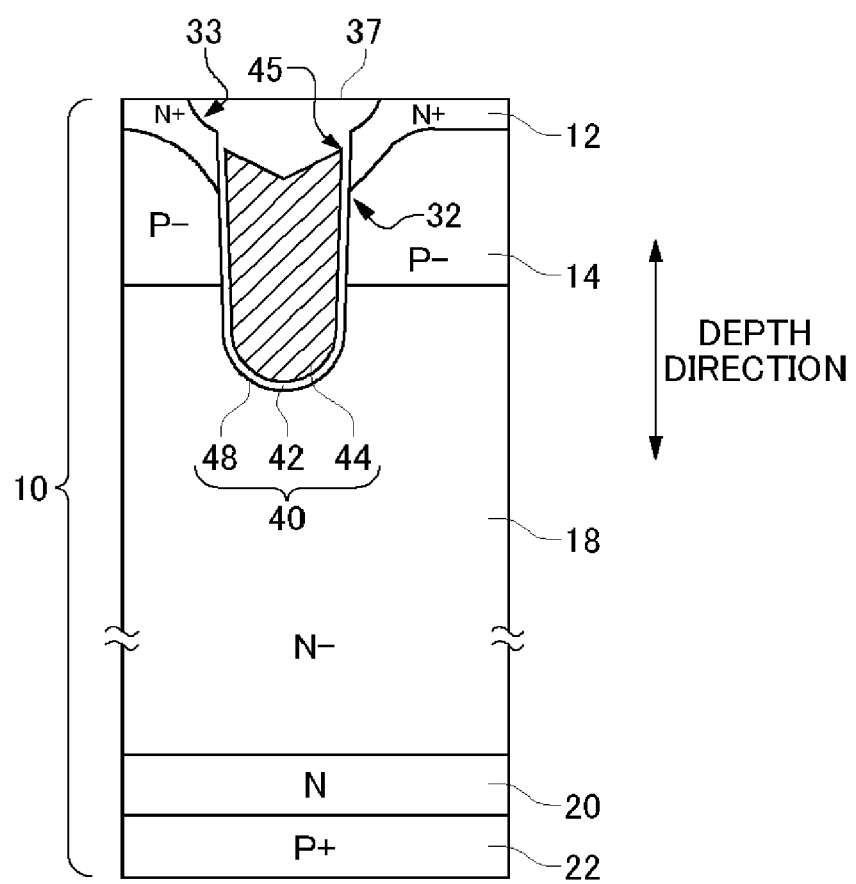
FIG. 14 shows a variation of the structure of a gate trench section.

FIG. 14 shows a variation of the structure of the gate trench section. In addition, although the following example will be described using the main gate trench section 40, a similar example is applied to the sense gate trench section 140. Also, in the following example, the structure in the semiconductor substrate 10 is shown, and there are cases where the interlayer insulating film, the metal electrode, or the like is omitted. Also, although an accumulation region 16 is omitted in the following example, the semiconductor device 100 may have the accumulation region 16.

An upper end 45 of the main gate conductive section 44 is provided at a position deeper than the front surface of the semiconductor substrate 10. That is, the upper end 45 of the main gate conductive section 44 falls into the gate trench 48. The upper end 45 of the main gate conductive section 44 refers to an end portion which is on the uppermost side of the main gate conductive section 44.

In a region within the gate trench 48 where the main gate conductive section 44 and the insulating film 42 are not provided, the main gate insulating section 37 is provided. Thereby, the main gate conductive section 44 is insulated from the main emitter electrode 52.

The main gate conductive section 44 at least includes a region that opposes the adjacent base region 14. When a predetermined voltage is applied to the main gate conductive section 44, a channel is formed on the surface layer of the interface that is in contact with the gate trench 48 in the base region 14.

In addition, in the cross-section of the semiconductor substrate 10 in the depth direction, an average tilt of the side wall of the gate trench 48 between the upper end 45 of the main gate conductive section 44 and the front surface of the semiconductor substrate 10 is larger than a tilt of the side wall at a position that opposes the upper end 45 of the main gate conductive section 44. In addition, the term of "tilt" in the present specification refers to a tilt with respect to the depth direction of the semiconductor substrate 10 in the cross-section, unless clearly indicated otherwise. For example, the "tilt" on the front surface of the semiconductor substrate 10 is substantially 90 degrees and the "tilt" of the straight line in parallel with the depth direction is zero degree. In addition, the average tilt of the side wall in a predetermined range of the gate trench 48 may be calculated by integrating the tilt of the side wall of the gate trench 48 in the cross-section over a given length of the side wall of the gate trench 48, and dividing the integration value with the predetermined length.

The gate trench 48 of the present example has a shoulder section 33 in a region that is in contact with the front surface of the semiconductor substrate 10. The shoulder section 33 is formed between the main gate conductive section 44 and the front surface of the semiconductor substrate 10 (that is, above the upper end 45 of the main gate conductive section 44) in the side wall of the gate trench 48. In the cross-section, the average tilt of the side wall of the gate trench 48 in the shoulder section 33 is smaller than the tilt of the side wall at a position that opposes the upper end 45 of the main gate conductive section 44. In addition, the tilt of the side wall of the gate trench 48 between the shoulder section 33 and the upper end 45 of the main gate conductive section 44 may be substantially equal to the tilt of the side wall of the gate trench 48 at a position that opposes the upper end 45 of the main gate conductive section 44.

In this way, the depth of the emitter region 12 in the region that is in contact with the gate trench 48 can be easily controlled by increasing the tilt of the side wall of the gate trench 48 above the upper end 45 of the main gate conductive section 44. The length of the remained base region 14 can be controlled by controlling the depth of the emitter region 12. The length of the base region 14 that is in contact with the gate trench 48 corresponds to the channel length. For this reason, the threshold voltage of the main transistor section 104 becomes easier to be controlled.

Figure 15:
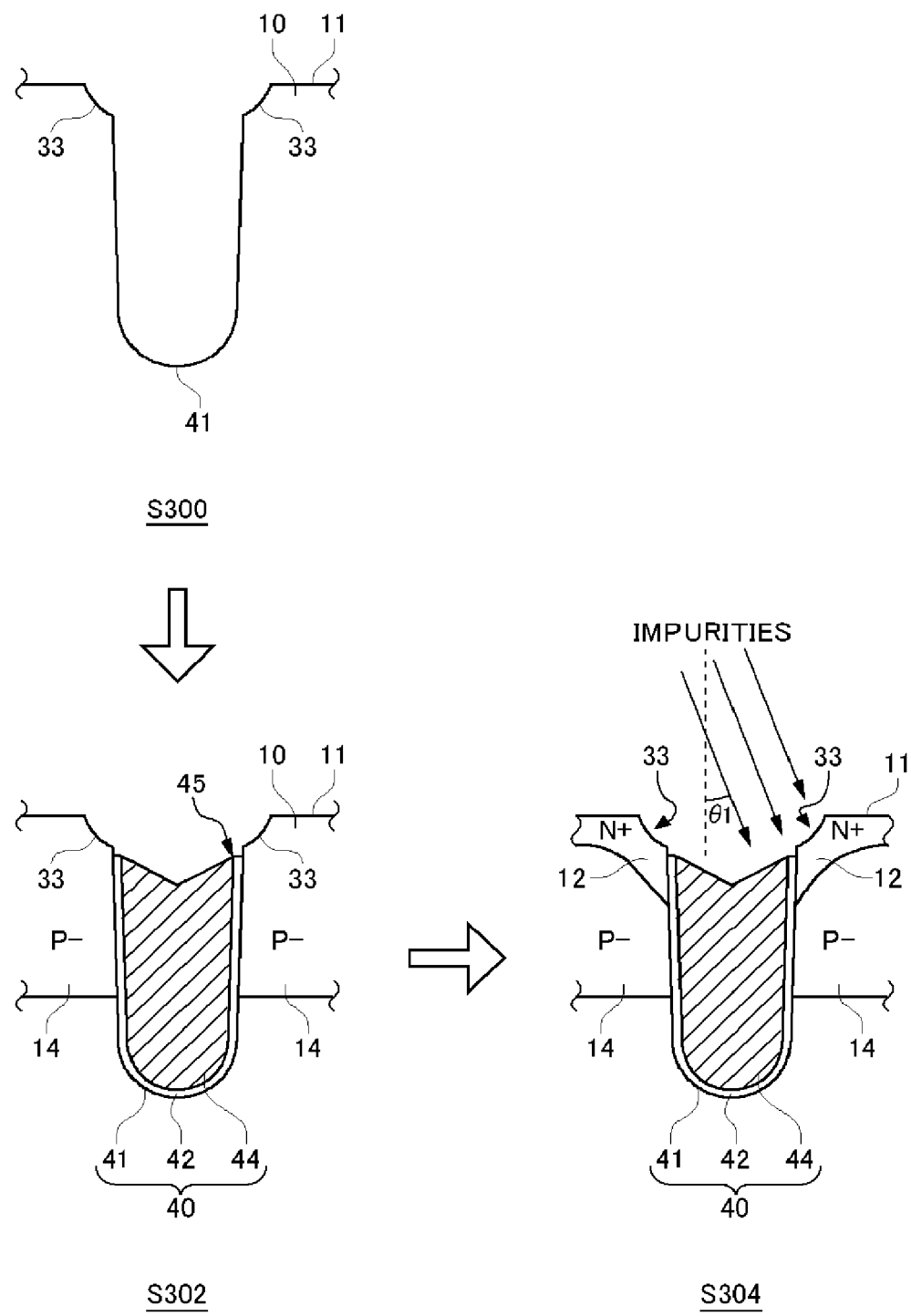
FIG. 15 illustrates a part of a step of manufacturing the main gate trench section 40 and an emitter region 12 in the semiconductor device 100.

FIG. 15 illustrates a part of a step of manufacturing the main gate trench section 40 and the emitter region 12 in the semiconductor device 100. First, in a gate trench forming step S300, the gate trench 48 is formed on the front surface of the semiconductor substrate 10. The gate trench 48 has a shoulder section 33 in a region that is in contact with the front surface of the semiconductor substrate 10. For example, the gate trench 48 having the shoulder section 33 may be formed by performing etching on the front surface of the semiconductor substrate 10 using a first mask having a predetermined opening to form the trench, and then performing etching on the edge portion of the trench using a second mask having an opening larger than that of the first mask.

Next, in a gate conductive section forming step S302, the insulating film 42 and the main gate conductive section 44 are formed in the inner wall of the gate trench 48. The insulating film 42 may be formed by oxidizing the semiconductor substrate 10. In addition, the main gate conductive section 44 is formed such that the upper end 45 of the main gate conductive section 44 is at a position deeper than the front surface 11 of the semiconductor substrate 10. In the present example, the upper end 45 of the main gate conductive section 44 is provided below the shoulder section 33. The main gate conductive section 44 is formed by polysilicon doped with impurities, for example.

After the main gate conductive section 44 is formed, the P-type impurities are injected and diffused into the front surface of the semiconductor substrate 10, and then the base region 14 is formed. The P-type impurities are boron, for example. The diffusion temperature of the base region 14 is approximately 1100 degrees, for example. In addition, the main gate trench section 40 may be formed after the base region 14 is formed.

Next, in an emitter region forming step S304, the N-type impurities are injected and diffused into the semiconductor substrate 10. The N-type impurities are arsenic, for example. Also, the P-type impurities such as boron are injected and diffused into the contact region 15. The impurities of the emitter region 12 and the contact region 15 may be diffused in the same step. The temperature of the diffusion step may be lower than the diffusion temperature of the base region 14. The temperature of the diffusion step is 1000 degrees or less, for example.

Thereby, the emitter region 12 is formed. In addition, in step S304, the impurities are injected into not only the front surface of the semiconductor substrate 10, but also the side wall of the gate trench 48 as well by using the main gate conductive section 44 as a mask. By such a method, the emitter region 12 is formed such that the portion that is in contact with the gate trench 48 is the deepest.

In step S304, the N-type impurities are diffused to the depth corresponding to the threshold voltage that the transistor section should have in the region that is in contact with the gate trench 48. When the impurities are diffused at a deeper position, the impurities need to be thermally treated for a longer period of time or at a higher temperature. However, performing thermal treatment over a long period of time degrades the manufacturing efficiency, and thus the thermal treatment at a high temperature is preferable. However, when the impurities are thermally treated at a high temperature, the length in which the impurities are diffused increases per unit time, and thus it is difficult to control the diffusion depth of the impurities.

Meanwhile, in the present example, the gate trench 48 has the shoulder section 33, and thus the length over which the impurities are diffused in the region that is in contact with the gate trench 48 can be decreased. That is, in a region where the shoulder section 33 is provided, the impurities are injected below the front surface 11 of the semiconductor substrate 10. For this reason, when the emitter region 12 having a predetermined depth is formed, the length over which the impurities must be diffused can be decreased.

For this reason, even if the impurities are diffused at a lower temperature, the thermal treatment time is not long, and thus the manufacturing efficiency does not degrade. Moreover, the impurities can be diffused at a low temperature, and thus the depth of the emitter region 12 in the region that is in contact with the gate trench 48 can be accurately controlled.

Also, the gate trench 48 has the shoulder section 33, so that the area of the mesa region sandwiched by the main gate trench sections 40 can be made small. For this reason, an electric injection enhancement effect (IE effect) can be obtained.

In addition, in S304, the impurities may be injected into the side wall of the gate trench 48 relative to the depth direction of the semiconductor substrate 10 from a direction having a predetermined tilt $\theta 1$. Thereby, the impurities can be efficiently injected. The tilt $\theta 1$ is 10 degrees or less, for example.

Also, the emitter region 12 is formed in a self-aligned manner taking the main gate conductive section 44 as a mask, and thus the emitter region 12 can be caused to be easily in contact with the main gate trench section 40. Meanwhile, when the emitter region 12 is formed using a mask independent from the main gate trench section 40, there are case in which the emitter region 12 and the main gate trench section 40 are not in contact with each other due to the manufacturing tolerance including alignment of the mask, and thus the semiconductor device 100 cannot be operated.

Figure 16:
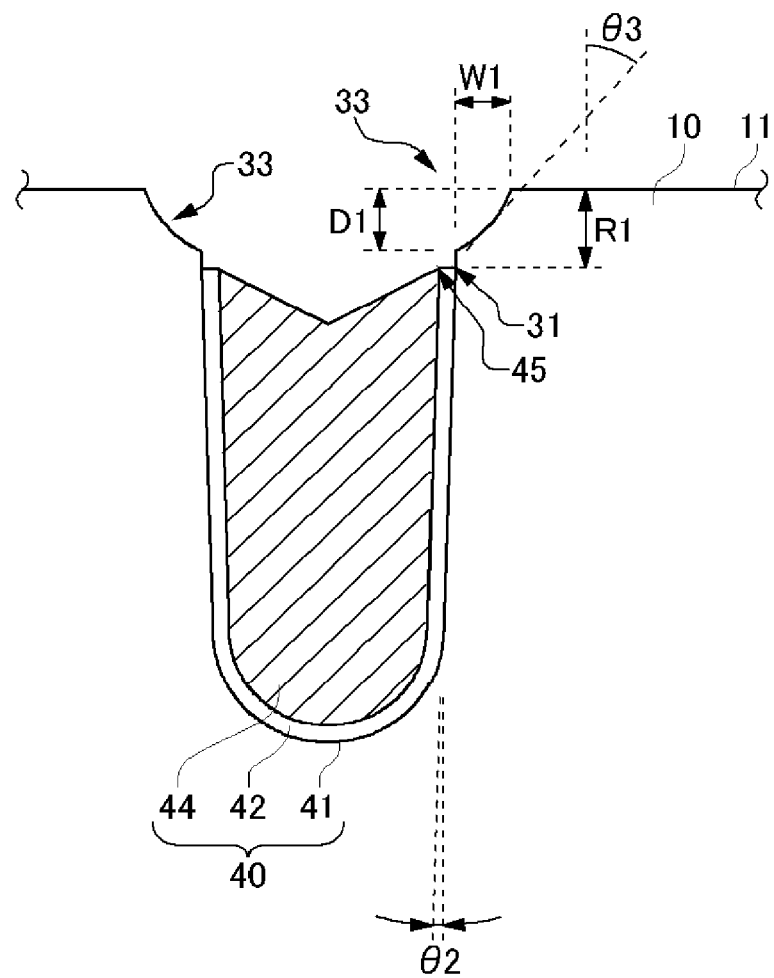
FIG. 16 illustrates the shape of the main gate trench section 40.

FIG. 16 illustrates the shape of the main gate trench section 40. In the present example, a tilt of the side wall of the gate trench 48 in the position 31 that opposes the upper end 45 of the main gate conductive section 44 is $\theta 2$. Also, the width of the shoulder section 33 in the opening of the gate trench 48 in its diameter direction and the length of the shoulder section 33 in the opening of the gate trench 48 in its depth direction are W1 and D1, respectively. In addition, a starting point of the shoulder section 33 may be the end portion of the side wall of the gate trench 48 on the front surface 11 of the semiconductor substrate 10. Also, an end point of the shoulder section 33 may be a position where the tilt of the side wall of the gate trench 48 is larger than the tilt $\theta 2$ of the side wall of the gate trench 48 by a predetermined value or more when going through the side wall of the gate trench 48 from the position 31 toward the front surface 11 of the semiconductor substrate 10. As one example, the predetermined value is 10 degrees. The predetermined value may be zero degree, 20 degrees, or 30 degrees.

The shoulder section 33 may have a protruding curved surface section toward the interior of the semiconductor substrate 10. That is, the tilt of the shoulder section 33 increases as the distance from the front surface of the semiconductor substrate 10 is longer. By such a shape of the shoulder section 33, the impurities can be injected at a deep position more efficiently. For this reason, the length of the impurity diffusion for forming the emitter region 12 of the predetermined depth can be shortened.

Also, the length D1 of the shoulder section 33 may be longer than the width W1 of the shoulder section 33. Thereby, the opening area of the gate trench 48 can be made small and miniaturized, and also the impurities can be injected at a deep position in a region adjacent to the gate trench 48. Also, the length D1 may be equal to the width W1, and the length D1 may be smaller than the width W1.

The width W1 of the shoulder section 33 may be no greater than half of the width of the gate trench 48 in the position 31, and may also be ¼ or less of the width of the gate trench 48 in the position 31. Thereby, an increase in the area of the gate trench 48 on the front surface 11 of the semiconductor substrate 10 can be suppressed. Also, the width W1 may be 1/20 or more of the width of the gate trench 48 in the position 31 and may also be 1/10 or more of the width of the gate trench 48 in the position 31. Thereby, the impurities can be implanted at a deep position efficiently.

Also, the length D1 of the shoulder section 33 may be no greater than half of the distance R1 between the upper end 45 of the main gate conductive section 44 and the front surface 11 of the semiconductor substrate 10. Also, the length D1 may be greater than half of the distance R1. Also, the length D1 may be substantially equal to the distance R1. As one example, when the length D1 is 90% or more and 110% or less of the distance R1, the length D1 and the distance R1 are regarded to be substantially equal.

Also, the side wall of the gate trench 48 has a portion having a tilt of 20 degrees or more between the upper end 45 of the main gate conductive section 44 and the front surface 11 of the semiconductor substrate 10. For example, at least a part of the tilt θ3 of the shoulder section 33 is 20 degrees or more. In this way, the impurities can be efficiently injected at a deep position by increasing the tilt of the side wall of the gate trench 48 above the upper end 45, and controlling the diffusion of the impurities into the region adjacent to the gate trench 48 can be made easier.

Figure 17:
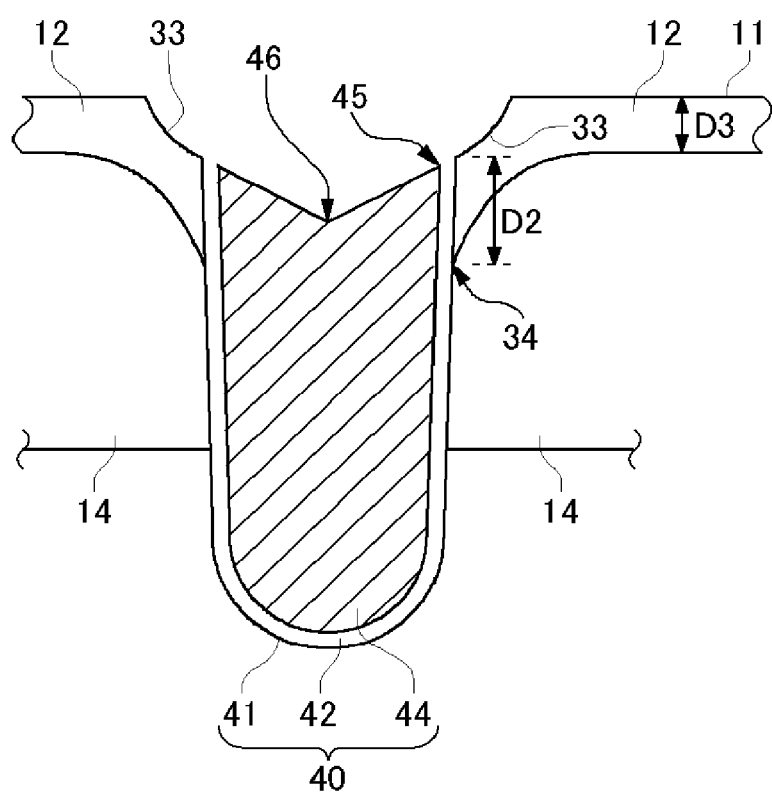
FIG. 17 illustrates the shape of the emitter region 12 and a main gate conductive section 44.

FIG. 17 illustrates the shapes of the emitter region 12 and the main gate conductive section 44. As described above, the impurities are injected from the inner wall of the gate trench 48 as well, and thus the emitter region 12 is provided at a position where the lower end 34 of the portion adjacent to the gate trench 48 is deeper than other portions. By such a shape, the length of the base region 14 in the region adjacent to the gate trench 48 can be controlled, and the threshold voltage of the semiconductor device 100 can be controlled.

Also, in the emitter region 12, the length D2 of the portion in its depth direction that is in contact with the gate trench 48 may be longer than the length of other portions in the emitter region 12. For example, the length D3 of the emitter region 12 in the mesa region where the gate trench 48 is not provided is shorter than the length D2.

Also, in the end surface of the main gate conductive section 44 closer to the front surface 11 of the semiconductor substrate 10, the portion adjacent to the side wall of the gate trench 48 (the upper end 45 in the present example) is formed at a position closest to the front surface 11 of the semiconductor substrate 10. In the present example, among the end surfaces of the main gate conductive section 44 closer to the front surface 11 of the semiconductor substrate 10, the portion 46 positioned at the center of the gate trench 48 is formed at a position farthest from the front surface 11 of the semiconductor substrate 10.

As one example, in the end surface of the main gate conductive section 44, the distance from the front surface of the semiconductor substrate 10 becomes gradually longer from the side wall of the gate trench 48 toward the center of the gate trench 48. That is, as the depth from the front surface 11 of the semiconductor substrate 10 increases, the thickness of the main gate conductive section 44 adjacent to the side wall of the gate trench 48 gradually increases. As described above, when the impurities are implanted at an angle taking the main gate conductive section 44 as a mask, in a part having a small thickness of the main gate conductive section 44, the impurities are injected into the semiconductor substrate 10 passing through the main gate conductive section 44. Thereby, in the region adjacent to the gate trench 48, the impurities can be easily injected and diffused into a deep position as viewed from the front surface 11 of the semiconductor substrate 10.

Figure 18A:
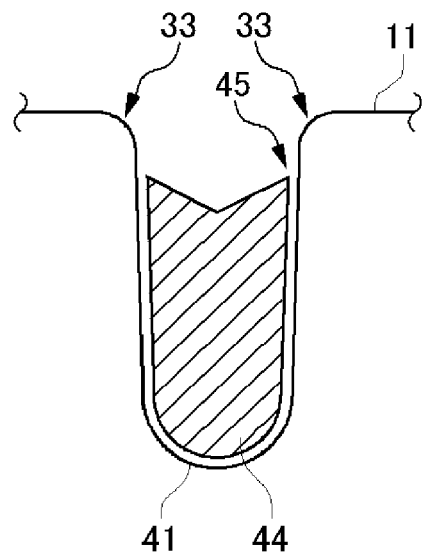
FIG. 18A shows a variation of the shape of a shoulder section 33.

FIG. 18A shows a variation of the shape of the shoulder sections 33. The shoulder section 33 of the present example has a protruding curved surface section toward the semiconductor substrate 10 on its front side. That is, the tilt of the shoulder section 33 of the present example decreases as the distance from the front surface of the semiconductor substrate 10 is longer. By also such a shape, the impurities can be easily diffused at a deep position as viewed from the front surface 11 of the semiconductor substrate 10.

Figure 18B:
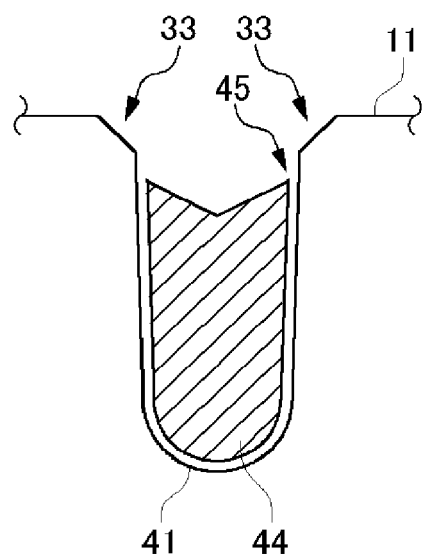
FIG. 18B shows a variation of the shape of the shoulder section 33.

FIG. 18B shows a variation of the shape of the shoulder sections 33. At least a part of the shoulder section 33 of the present example has a linear shape. The linear shape has a tilt greater than the tilt θ2 of the side wall of the gate trench 48 at a position that opposes the upper end 45 of the main gate conductive section 44 by a predetermined value or more. The predetermined value may be 10 degrees, may be 20 degrees, and may also be 30 degrees. By also such a shape, the impurities can be easily diffused at a deep position as viewed from the front surface 11 of the semiconductor substrate 10.

Figure 19:
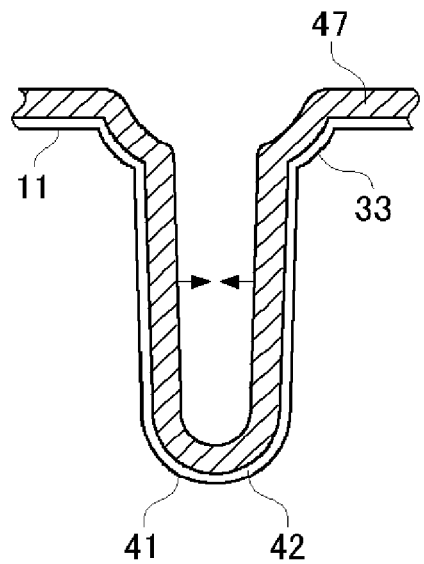
FIG. 19 shows one example of a step of manufacturing the main gate conductive section 44.
Figure 19:
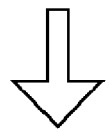
Figure 19:
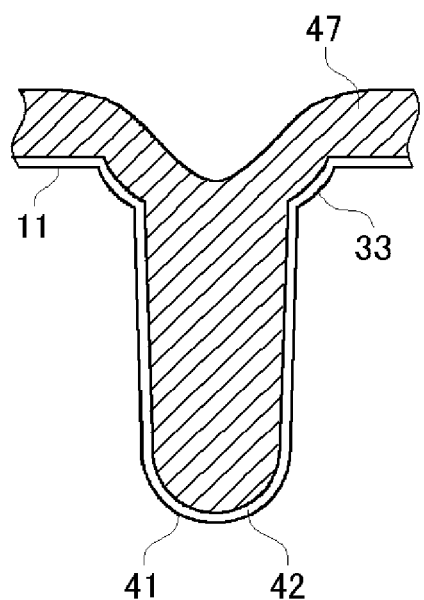

FIG. 19 shows one example of the step of manufacturing the main gate conductive section 44. First, the gate trench 48 having the shoulder section 33 is formed on the front surface 11 of the semiconductor substrate 10. Next, the insulating film 42 is formed on the gate trench 48 and the front surface of the semiconductor substrate 10. Next, the conductive materials 47 are deposited on the gate trench 48 and the front surface of the semiconductor substrate 10. As the conductive materials 47 are deposited, the thickness of the conductive materials 47 deposited in the side wall increases within the gate trench 48. Also, the conductive material 47 maintains the shape along the shoulder section 33, while the thickness of the conductive material 47 increases.

If the conductive material 47 is filled in the center of the gate trench 48, as shown in the lower part of FIG. 19, the conductive materials 47 above the opening of the gate trench 48 has a protruding shape below. Then, the main gate conductive section 44 as shown in FIG. 17 is formed by performing etching on the conductive material 47 at a predetermined depth within the gate trench 48. In this way, the gate trench 48 has the shoulder section, so that the main gate conductive section 44 in which the top surface has a downward projection can be formed easily. For this reason, the impurities can be easily injected into the side surface of the gate trench 48.

Figure 20:
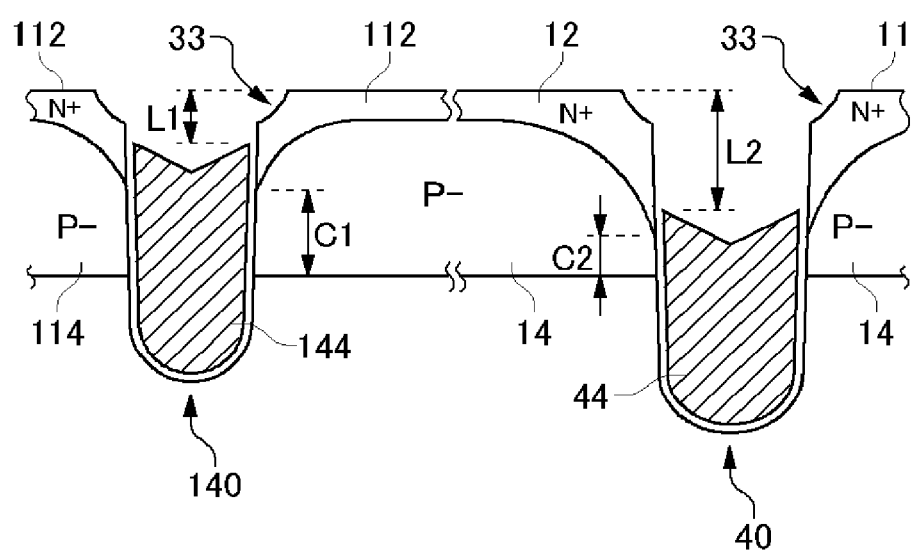
FIG. 20 shows a configurational example of a sense gate trench section 140 and the main gate trench section 40.

FIG. 20 shows a configurational example of the sense gate trench section 140 and the main gate trench section 40. In the present example, similar to the examples of FIG. 12 and FIG. 13, the threshold voltage of the sense transistor section 108 is higher than the threshold voltage of the main transistor section 104.

In the present example, the distance between the upper end of the sense gate conductive section 144 in the sense gate trench section 140 and the front surface 11 of the semiconductor substrate 10 is L1. Also, the distance between the upper end of the main gate conductive section 44 in the main gate trench section 40 and the front surface 11 of the semiconductor substrate 10 is L2. The distance L1 is shorter than the distance L2.

As described above, as the distance between the upper end of the gate conductive section and the front surface 11 of the semiconductor substrate 10 is longer, the emitter region adjacent to the gate trench 48 is deeper, and the channel length is shortened. For this reason, the channel length C1 of the sense gate trench section 140 is longer than the channel length C2 of the main gate trench section 40. For this reason, the threshold voltage of the sense gate trench section 140 is higher than the threshold voltage of the main gate trench section 40.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order. Also, "on" and "under" in the claims or the specification refer to directions opposite to each other. However, the term of "on" is not limited to a direction opposite from the gravity direction. Also, the term of "under" is not limited to the gravity direction.

DESCRIPTION OF REFERENCE NUMERALS

10: semiconductor substrate, 11: front surface, 12: emitter region, 14: base region, 15: contact region, 16: accumulation region, 17: main well region, 18: drift region. 20: buffer region, 22: collector region, 24: collector electrode, 26: interlayer insulating film, 30: main dummy trench section, 31: position, 33: shoulder section, 34: lower end, 37: main gate insulating section, 40: main gate trench section, 41: opposing section, 42: insulating film, 43: protruding section, 44: main gate conductive section, 45: upper end, 46: portion, 47: conductive material, 48: gate trench, 50: gate electrode, 51: gate terminal, 52: main emitter electrode, 53: emitter terminal, 54: contact hole, 55: contact hole, 100: semiconductor device, 102: active region, 103: gate pad, 104: main transistor section, 105: outer region, 106: diode section, 108: sense transistor section, 109: edge termination structure, 112: emitter region, 114: base region, 115: contact region, 116: accumulation region, 117: sense well region, 120: well separation region, 130: sense dummy trench section, 132: insulating film, 134: sense dummy conductive section, 137: sense gate insulating section, 140: sense gate trench section, 141: opposing section, 142: insulating film, 143: protruding section, 144: sense gate conductive section, 151: gate electrode, 152: sense emitter electrode, 154: contact hole, 155: contact hole, 156: connection gate trench section, 161: first trench section, 162: second trench section, 200: semiconductor device, 210: semiconductor substrate, 212: emitter region, 214: base region, 215: contact region, 216: accumulation region, 217: well region, 218: drift region, 220: buffer region, 221: polysilicon layer, 222: collector region, 224: collector electrode, 225: polysilicon layer, 226: contact hole, 228: contact hole, 230: dummy trench section, 232: insulating film, 234: dummy conductive section, 238: insulating section, 240: gate trench section, 242: insulating film, 244: gate conductive section: 248: polysilicon layer, 249: contact hole, 250: gate electrode, 251: gate terminal, 252: emitter electrode, 253: emitter terminal, 254: contact hole, 260: emitter trench section, 262: insulating film, 264: emitter conductive section, 270: transistor section, 280: diode section, 282: cathode region

What is claimed is:

1. A semiconductor device, comprising:
a semiconductor substrate of a first conductivity type, the semiconductor substrate including a p-type base region on a front surface of the semiconductor substrate, and an n-type emitter region on the p-type base region;
a main transistor section in an active region on the semiconductor substrate; and
a sense transistor section outside the active region on the semiconductor substrate,
wherein the active region is provided with a main well region of a second conductivity type,
wherein the p-type base region is shallower and has lower concentration than the main well region,
wherein an emitter electrode is provided on the front surface of the semiconductor substrate, in contact with the p-type base region and the n-type emitter region,
wherein the sense transistor section has a sense gate trench section formed extending from the outside of the active region to the main well region on a front surface of the semiconductor substrate,
wherein the sense gate trench section penetrates through the p-type base region and the n-type emitter region, and
wherein a sense gate conductive section in the sense gate trench section is insulated from the emitter electrode.

2. The semiconductor device according to claim 1, wherein the semiconductor substrate has:
a sense well region of a second conductivity type outside the active region; and
a well separation region of a first conductivity type that separates the sense well region and the main well region,
wherein the sense gate trench section is formed crossing the well separation region on the front surface of the semiconductor substrate.

3. The semiconductor device according to claim 1, further comprising a diode provided in the active region on the semiconductor substrate, wherein the sense transistor section is provided at a position that does not oppose the diode.

4. The semiconductor device according to claim 2, wherein the main transistor section has a main gate trench section electrically connected to the sense gate trench section.

5. The semiconductor device according to claim 4, wherein the main gate trench section is provided within the semiconductor substrate separately from the sense gate trench section.

6. The semiconductor device according to claim 5, further comprising a gate electrode provided over the main well region,
wherein the main gate trench section has a main gate trench formed on the front surface of the semiconductor substrate, and a main gate conductive section formed within the main gate trench,
wherein the sense gate trench section has a sense gate trench formed on the front surface of the semiconductor substrate, and a sense gate conductive section formed within the sense gate trench, and wherein the gate electrode is in contact with both the main gate conductive section and the sense gate conductive section.

7. The semiconductor device according to claim 4, wherein the main gate trench section is connected to the sense gate trench section within the semiconductor substrate.

8. The semiconductor device according to claim 7, wherein the main gate trench section has a plurality of first trench sections provided extending in a predetermined extending direction, and a second trench section which is provided extending in a direction different from the extending direction and which connects two adjacent first trench sections.

9. The semiconductor device according to claim 8, further comprising a gate electrode formed passing over the second trench section, and crossing over a plurality of the first trench sections.

10. The semiconductor device according to claim 4, wherein on the semiconductor substrate, an emitter region adjacent to the sense gate trench section, and an emitter region which is formed at a position deeper than the emitter region adjacent to the sense gate trench section and which is adjacent to the main gate trench section are formed.

11. The semiconductor device according to claim 10, wherein the sense gate trench section has a sense gate conductive section within a trench, wherein the main gate trench section has a main gate conductive section within a trench, and wherein a distance from the front surface of the semiconductor substrate to an upper end of the sense gate conductive section is shorter than a distance from the front surface of the semiconductor substrate to an upper end of the main gate conductive section.

12. The semiconductor device according to claim 10, further comprising a connection gate trench section which connects the sense gate trench section and the main gate trench section, wherein the connection gate trench section is formed in at least one of the main well region and the sense well region.

\* \* \* \* \*